(12) United States Patent
Luo et al.

(10) Patent No.: US 12,160,998 B2
(45) Date of Patent: Dec. 3, 2024

(54) MAGNETIC TUNNEL JUNCTION STRUCTURES AND RELATED METHODS

(71) Applicants: Taiwan Semiconductor Manufacturing Co., Ltd., Hsinchu (TW); National Taiwan University, Taipei (TW)

(72) Inventors: Zong-You Luo, Hsinchu (TW); Ya-Jui Tsou, Hsinchu (TW); I-Cheng Tung, Hsinchu (TW); CheeWee Liu, Hsinchu (TW)

(73) Assignees: Taiwan Semiconductor Manufacturing Co., Ltd., Hsinchu (TW); National Taiwan University, Taipei (TW)

( * ) Notice: Subject to any disclaimer, the term of this patent is extended or adjusted under 35 U.S.C. 154(b) by 186 days.

(21) Appl. No.: 17/871,676

(22) Filed: Jul. 22, 2022

(65) Prior Publication Data

US 2022/0359615 A1 Nov. 10, 2022

Related U.S. Application Data

(62) Division of application No. 16/400,626, filed on May 1, 2019, now Pat. No. 11,605,670.

(60) Provisional application No. 62/752,925, filed on Oct. 30, 2018.

(51) Int. Cl.
*G11C 11/16* (2006.01)
*H10B 61/00* (2023.01)
*H10N 50/01* (2023.01)
*H10N 50/10* (2023.01)
*H10N 50/80* (2023.01)
*H10N 50/85* (2023.01)

(52) U.S. Cl.
CPC ............ *H10B 61/22* (2023.02); *G11C 11/161* (2013.01); *G11C 11/1675* (2013.01); *H10N 50/01* (2023.02); *H10N 50/10* (2023.02); *H10N 50/80* (2023.02); *H10N 50/85* (2023.02)

(58) Field of Classification Search
CPC ... H10B 61/22; G11C 11/161; G11C 11/1675; G11C 11/1657; G11C 11/1673; G11C 11/1693; G11C 11/18; G11C 11/1659; H10N 50/01; H10N 50/10; H10N 50/80; H10N 50/85; H10N 52/01
See application file for complete search history.

(56) References Cited

U.S. PATENT DOCUMENTS

| | | |
|---|---|---|
| 2016/0276006 A1 | 9/2016 | Ralph et al. |
| 2018/0240844 A1 | 8/2018 | Yang et al. |
| 2018/0277749 A1 | 9/2018 | Urabe et al. |
| 2018/0301266 A1 | 10/2018 | Ou et al. |
| 2020/0058338 A1 | 2/2020 | Ishikawa et al. |
| 2020/0286536 A1* | 9/2020 | Fukami ................ H01L 29/82 |

* cited by examiner

*Primary Examiner* — Xiaochun L Chen
(74) *Attorney, Agent, or Firm* — Seed IP Law Group LLP

(57) ABSTRACT

The disclosure is directed to spin-orbit torque MRAM structures and methods. A SOT channel of the SOT-MRAM includes multiple heavy metal layers and one or more dielectric dusting layers each sandwiched between two adjacent heavy metal layers. The dielectric dusting layers each include discrete molecules or discrete molecule clusters of a dielectric material scattered in or adjacent to an interface between two adjacent heavy metal layers.

20 Claims, 18 Drawing Sheets

MAGNETIC TUNNEL JUNCTION STRUCTURES AND RELATED METHODS

Magnetoresistive random-access memory ("MRAM") is a promising non-volatile data storage technology. The core of a MRAM storage cell (or "bit") is a magnetic tunnel junction ("MTJ") in which a dielectric layer is sandwiched between a magnetic fixed layer ("reference layer") and a magnetic free layer ("free layer") whose magnetization orientation can be changed. Due to the tunnel magnetoresistance effect, the resistance value between the reference layer and the free layer changes with the magnetization orientation switch in the free layer. Parallel magnetizations ("P state") lead to a lower electric resistance, whereas antiparallel magnetizations ("AP state") lead to a higher electric resistance. The two states of the resistance values are considered as two logic states "1" or "0" that are stored in the MRAM cell.

In a spin transfer torque MRAM ("STT-MRAM") cell, the write current is applied passing through the entire MTJ, i.e., reference layer, the dielectric layer, and the free layer, which sets the magnetization orientation of the free layer through the spin transfer torque effect. That is, the write current passes through a same path as the read path of the MRAM. In a spin-orbit torque MRAM ("SOT-MRAM") cell, a MTJ structure is positioned on a heavy metal layer with large spin-orbit interaction. The free layer is in direct contact with the heavy metal layer. Spin torque is induced by the in-plane current injected through the heavy metal layer under the spin-orbit coupling effect, which generally include one or more of the Rashba effect or the spin Hall effect ("SHE effect"). The write current does not pass through the vertical MTJ. Instead, the write current passes through the heavy metal layer. The magnetization orientation in the free layer is set through the spin-orbit torque effect. More specifically, when a current is injected in-plane in the heavy metal layer, the spin orbit coupling leads to an orthogonal spin current which creates a spin torque and inducing magnetization reversal in the free layer.

BRIEF DESCRIPTION OF THE DRAWINGS

Aspects of the present disclosure are best understood from the following detailed description when read with the accompanying figures. In the drawings, identical reference numbers identify similar elements or acts unless the context indicates otherwise. The sizes and relative positions of elements in the drawings are not necessarily drawn to scale. In fact, the dimensions of the various features may be arbitrarily increased or reduced for clarity of discussion.

DETAILED DESCRIPTION

Figure 1:
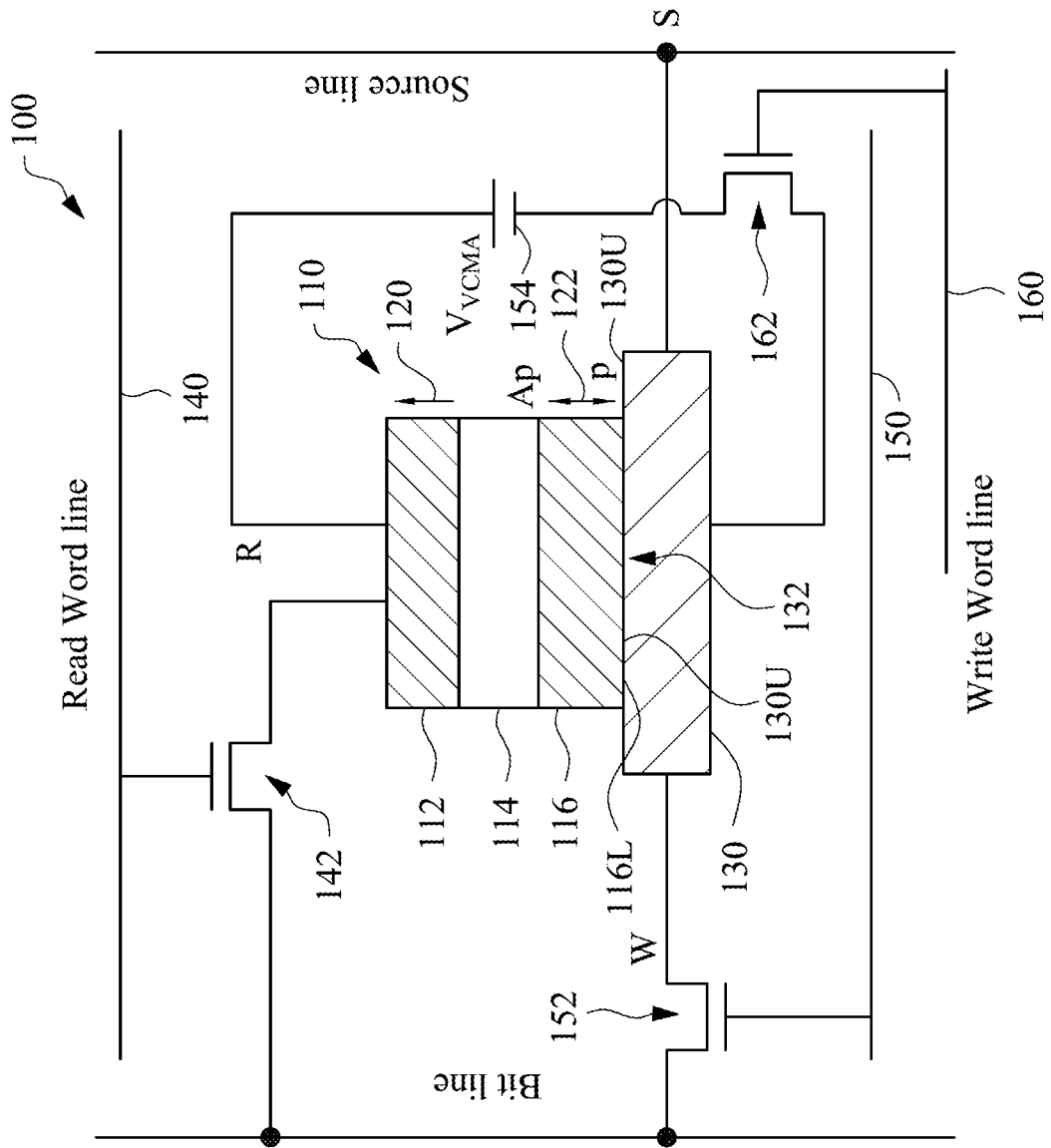
FIG. 1 is an example MRAM cell according to example embodiments of the disclosure.

The current techniques in accordance with embodiments described herein are created based on the observation that in perpendicular spin-orbit torque ("SOT") MRAM systems, the application of the SOT current tend to pull the magnetization orientation of the free layer from a vertical orientation, either AP or P with respect to that of the reference layer, to an in-plane orientation following the shape anisotropy of the free layer. However, this in-plane magnetization orientation is temporary and is maintained only under the SOT effect. After the SOT current is removed, the magnetization orientation of the free layer may settle back to a perpendicular orientation randomly in one of the AP or the P state. That is, the SOT effect does not determinatively switch the state of the MTJ, and the perpendicular MTJ has a substantially equal probability of settling in a P state or in an AP state after the SOT effect. Conventionally, an external in-plane magnetic field is applied determinatively settle the perpendicular magnetization orientation of the free layer, together with the SOT effect. However, the external magnetic field is detrimental to the device or the circuit and the operations thereof. A large canting angle between the shape anisotropy of the free layer, e.g., a long-axis of an elliptic free layer, and the SOT current flow direction may also be used to help set the perpendicular magnetization orientation of the free layer. A large canting angle is usually in the range of 30 degree to 60 degree or 120 degree to 150 degree. However, such a large canting angle substantially increases power consumption and/or reduces switching speed.

The disclosed techniques are directed to a new SOT-MRAM structure where a voltage controlled magnetic anisotropy ("VCMA") is adopted to determinatively set the perpendicular magnetization orientation of the free layer. Specifically, in an embodiment, a VCMA voltage source is coupled between the reference layer and the free layer of the MTJ structure of the SOT-MRAM. As such, the VCMA voltage source basically applies a VCMA voltage on the tunnel barrier layer of the MTJ structure. In an embodiment, the VCMA voltage is sufficiently large to overcome/eliminate the energy barrier accumulated by the tunnel barrier layer that prevents the switching between the AP state and the P state of the MTJ structure. At the same while, the VCMA voltage is not so large as to break the dielectric barrier of the tunnel barrier layer like in the STT-MRAM configurations. For this reason, in some embodiment, the tunnel barrier layer may have a larger thickness than comparable SOT-MRAM devices that does not have the VCMA mechanism.

The VCMA voltage is applied after the SOT current pulls the free layer magnetization into the in-plane shape anisotropy orientation. With the SOT current removed, the VCMA voltage functions to remove the energy barrier accumulated around the tunnel barrier layer of the MTJ. Without the energy barrier, the magnetization orientation of the free layer enters into a precession process and rotate/circles around the shape anisotropy of the free layer. Removal of the VMCA voltage ends the procession. With proper timing of removing the VCMA voltage, which corresponds to a position of the magnetization orientation at the end of the precession process ("precession end position"), the magnetization orientation of the free layer will settle at one of the AP or P state determinatively. Specifically, after the VCMA voltage is removed to end the precession, the magnetization orientation of the free layer will settle at a perpendicular orientation adjacent to the precession end position.

The precession process may be simulated or experimentally studied to determine the timing to start or to stop applying the VCMA voltage. In another embodiment, the precession process may be monitored in real time to determine a time point to stop the VCMA voltage such that the state of the MTJ settles deterministically. In an embodiment, an early settlement of the MTJ state is preferred to improve the switching speed of the MRAM.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

FIG. 1 shows an example MTJ bit cell 100 of a SOT-MRAM device. The bit cell 100 includes a MTJ structure 110 that includes a dielectric layer 114 sandwiched between a first ferromagnetic layer 112 and a second ferromagnetic layer 116. The first ferromagnetic layer 112 and the second ferromagnetic layer 116 include a same type of perpendicular magnetic anisotropy. The magnetization of the first ferromagnetic layer 112 maintains a fixed orientation or orientation, e.g., in the up direction as shown by a unidirectional arrow 120, perpendicular to a substrate plane (not shown for simplicity) or a plane which the MTJ 110 seats on. The magnetization orientation of the second ferromagnetic layer 116 is switchable in the perpendicular axis, as shown by a bi-directional arrow 122. The switchable magnetization orientation of the second ferromagnetic layer 116 represents two states thereof with respect to the magnetization orientation of the first ferromagnetic layer 112, a parallel state "P" or an antiparallel state "AP". In the "P" state, the magnetization orientation of the second ferromagnetic layer 116 is in the same direction as that of the first ferromagnetic layer 112, here in the down direction. In the "AP" state, the magnetization orientation of the second ferromagnetic layer 116 is in a different direction as that of the first ferromagnetic layer 112, here in the up direction. In the description herein, the first ferromagnetic layer 112 is referred to as a "reference layer" and the second ferromagnetic layer 116 is referred to as a "free layer". The dielectric layer 114 is a tunnel barrier layer that barriers the tunneling of charge carriers between the reference layer 112 and the free layer 116.

A SOT metal layer 130 is positioned adjacent to and in electric coupling with the free layer 116. In an embodiment, the SOT metal layer 130 is in direct contact with the free layer 116. For example, an upper surface 130U of the SOT metal layer 130 is in direct contact with a lower surface 116L of the free layer 116. In some embodiment, to maximize the spin Hall effect ("SHE") between the SOT metal layer 130 and the free layer 116, an interface area 132 between the SOT metal layer 130 and the free layer 116 substantially fully overlaps the lower surface 116L of the free layer 116. That is, the upper surface 130U of the SOT metal layer 130 substantially fully overlap the lower surface 116L of the free layer 116. In an embodiment, the upper surface 130U is larger than the lower surface 116L in at least some directions.

Due to the tunnel magnetoresistance effect, the resistance value between the reference layer 112 and the free layer 116 changes with the magnetization orientation switch in the free layer 116. The parallel magnetizations ("P state") lead to a lower electric resistance across the MTJ 110, whereas the antiparallel magnetizations ("AP state") lead to a higher electric resistance across the MTJ 110. The two states of the resistance values are considered as two logic states "1" or "0" that are stored in the MRA \4 bit cell 100. In the description herein, the P or AP state are also used to refer to the magnetization orientation in the free layer 116 with respect to that of the reference layer 112.

The bit cell 100 includes at least three terminals R, W and S. In a read operation, a signal from a read control line, e.g., a read Word line 140, turns on a read transistor 142 to enable a read current to flow between a Bit line and a source line through the MTJ structure 110. A value of the read current indicates the resistance value of the MTJ 110, i.e., the logic state stored in the MRAM cell 100. In a write operation, a signal from a write control line, e.g., a first write Word line 150, turns on a first write transistor 152 to enable a write current to pass through the SOT metal layer 130 to generate a spin-orbit torque ("SOT") that changes the magnetization orientation of the free layer 116. The mechanisms of the SOT effect include one or more of spin Hall effect ("SHE") or a Rashba effect. The relative ratios between the SHE and the Rashba effect depend on the device structure, fabrication processes and/or material choices. However, the current disclosure is applicable to and is not limited by any of these factors and any resultant ratios between the SHE and Rashba effect. In the description herein, it is assumed that SHE dominates the spin-orbit torque ("SOT"). The terms "SHE" or "SOT" may be used interchangeably in referring to the spin-orbit torque effect.

A voltage source $V_{VCMA}$ 154 is coupled to introduce an electric field across the tunnel barrier layer 114 of the MTJ 110. In an embodiment, the $V_{VCMA}$ 154 is coupled between the reference layer 112 and the free layer 116. More specifically, in an embodiment, the VCMA voltage 154 is coupled between the reference layer 112 and the SOT metal layer 130, which is conductive and connected to the free layer 112. In an embodiment, the $V_{VCMA}$ 154 may be coupled between the R terminal and one of the W or S terminal. Other coupling configurations are also possible and included in the disclosure. In an embodiment, the $V_{VCMA}$ 154 is a unidirectional DC voltage, e.g., always positive or always negative. For example, the high potential end of the $V_{VCMA}$ 154 is coupled to the reference layer 112 and the low potential end of the $V_{VCMA}$ 154 is coupled to the free layer 122, e.g., through the SOT metal layer 130. Because the reference layer 112 and the free layer 116 are both conductive, the $V_{VCMA}$ 154 basically applies on to the barrier layer 114. The application of the $V_{VCMA}$ 154 will reduce or remove the energy barrier accumulated on the two sides of the barrier layer 114 that hampers a switching between the AP state and the P state of the MTJ structure 110. The application of the $V_{VCMA}$ 154 is controlled by a second write transistor 162. A signal line 160 controls the on/off of the second write transistor 162. In an embodiment, the signal line 160 is a second write line, which works together with the first write line 150 in completing the "write" operation. In an embodiment, the signal line 150 and the signal line 160 turn on the switch 152 and the switch 162 sequentially in a write operation, as further described herein. In an embodiment, the signal line 150 and the signal line 160 are timing control outputs of a same write signal line. Other suitable configurations to implement the timing control of the first write transistor 152 or the second write transistor 162 are also possible and included in the disclosure.

In some embodiments, a bidirectional current may be applied through the SOT metal layer 130 for P to AP state change and for the AP to P state change, respectively. For the VCMA voltage 154, a unidirectional DC voltage, is used for both the P to AP state change and for the AP to P state change. The voltage value of the $V_{VCMA}$ 154 may be different between the AP to P state switch and the P to AP state switch because the involved energy barriers may be different. In an embodiment, the $V_{VCMA}$ 154 may apply a larger voltage value in the AP to P state switch than the P to AP state switch.

In an embodiment, the free layer 116 is one or more of Fe, Co, Ni, FeCo, CoNi, CoFeB, FeB, FePt, FePd or other suitable ferromagnetic material. The reference layer 112 is one or more of Fe, Co, Ni, FeCo, CoNi, CoFeB, FeB, FePt, FePd or other suitable ferromagnetic material. In an embodiment, the reference layer 112 is a synthetic anti-ferromagnetic structure that includes one or more non-magnetic ("NM") metal layers each sandwiched between two pinned ferromagnetic ("FM") layers. In an embodiment, the free layer 116 is a synthetic anti-ferromagnetic structure that includes a non-magnetic metal layer sandwiched between two free ferromagnetic layers. For example, the free layer 116 may include a Ta layer sandwiched between two CoFeB layers. In an example, a composition of a CoFeB material may be $Co_{20}Fe_{60}B_{20}$ or other suitable compositions. The tunnel barrier layer 114 is MgO or other suitable heavy metal materials.

The tunnel barrier layer 114 is MgO, $Al_2O_3$ or other suitable dielectric materials.

The SOT metal layer 130 is a heavy metal layer of Ta, W, Pt, Cu, Au or other suitable metal materials or a combination of such metal materials with dielectric materials.

In some embodiment, a capping layer (not shown for simplicity), e.g., of $WO_2$, NiO, MgO, $Al_2O_3$, $Ta_2O_5$, $MoO_2$, TiO, GdO, Al, Mg, Ta, Ru other suitable materials are formed over the reference layer 112.

The example structure MTJ 110 is provided as an illustrative example of a SOT-MRAM cell. Alternative or additional MTJ structures and silicon implementations are also possible and included in the disclosure. For example the SOT-MRAM cell may also include a synthetic anti-ferromagnetic ("AFM") structure layer adjacent to the reference layer 112 to pin the magnetization orientation of the reference layer 112. The synthetic AFM structure may include one or more of buffer layers of Ta, Ru or other suitable materials, one or more ferromagnetic ("FM") layers of Co, Fe or other FM materials, one or more ferromagnetic/non-ferromagnetic FM/NM multilayers of Co/Pt, Co/Pd or other combinations of FM/NM materials, or other layers in a synthetic AFM structure. The antiferromagnetic layer and (or ferromagnetic biasing layer) functions to pin the magnetization orientation of the reference layer 112. A bottom electrode may be formed adjacent to the SOT metal layer 130 and a top electrode may be formed adjacent to the reference layer 112. These additional or alterative features are all possible and included in the disclosure.

FIG. 1 shows that in the MTJ structure 110, the free layer 116 is stacked below the reference layer 112 for illustrative purposes. In other embodiment, the free layer 116 is stacked over the reference layer 112 and the SOT metal layer 130 is position adjacent to the free layer 116 over the reference layer 112.

In the description herein, the read and write lines of the MRAM cells are illustrated as implemented through Word lines, which is not limiting. It is also possible, depending on MRAM circuitry design, that the read and write lines are implemented through Bit lines.

Figure 2:
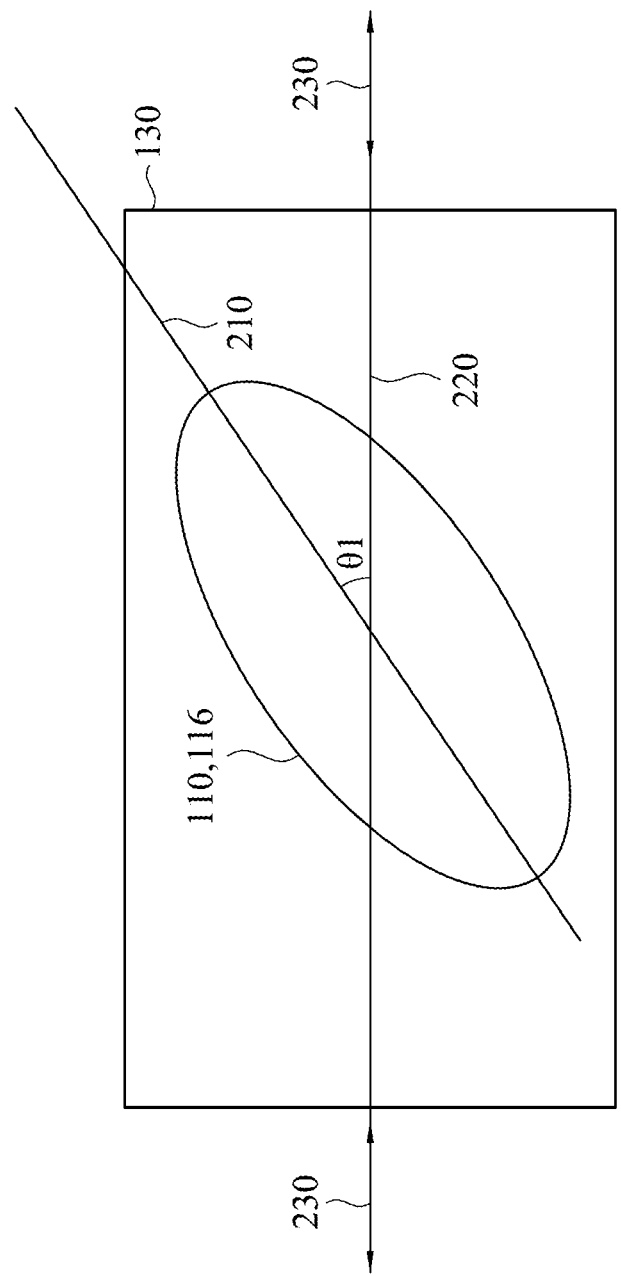
FIG. 2 is an top view of an example MTJ structure positioned with respect to an SOT metal layer according to example embodiments of the disclosure.

In another example, a shape anisotropy, e.g., a long axis, of the MTJ structure 110 may be positioned with a canting angle with a flow direction of the SOT current. FIG. 2 shows a top view of the MTJ structure 110 together with the SOT metal layer 130. As shown in FIG. 2, the MTJ 110 is positioned over the SOT metal layer 130 in a canting configuration. For example, the long axis 210 of the elliptic cylindrical MTJ 110 (or specifically, the free layer 116) has a canting angle θ1 with respect to the path 220 of the write current 230. The canting angle θ1 is used to help the magnetization orientation of the free layer 116 to engage into a precession process after the SOT current of the SOT metal layer 130 is removed. The canting angle θ1 is not used to determinatively settle the magnetization orientation of the free layer 116 under the SOT effect. As such, the canting angle θ1 does not need to be large. In an embodiment, the canting angle θ1 may be smaller than ±5 degree (or larger than ±85 degree) in a range between about 1 degree to about 5 degree. Larger canting angles (larger than 5 degree or smaller than 85 degree) are possible dependent on device or system design requirements. A non-zero canting configuration is preferable to enhance the precession process, although a zero canting angle is also possible under the disclosure techniques. Such a small canting angle is made possible due to the use of the $V_{VMCA}$ 154 in addition to an $I_{SOT}$ 230 in the write operation as described herein. Such a small or zero canting angle θ1 improves power efficiency of a MRAM device having the MTJ 110.

Figure 3:
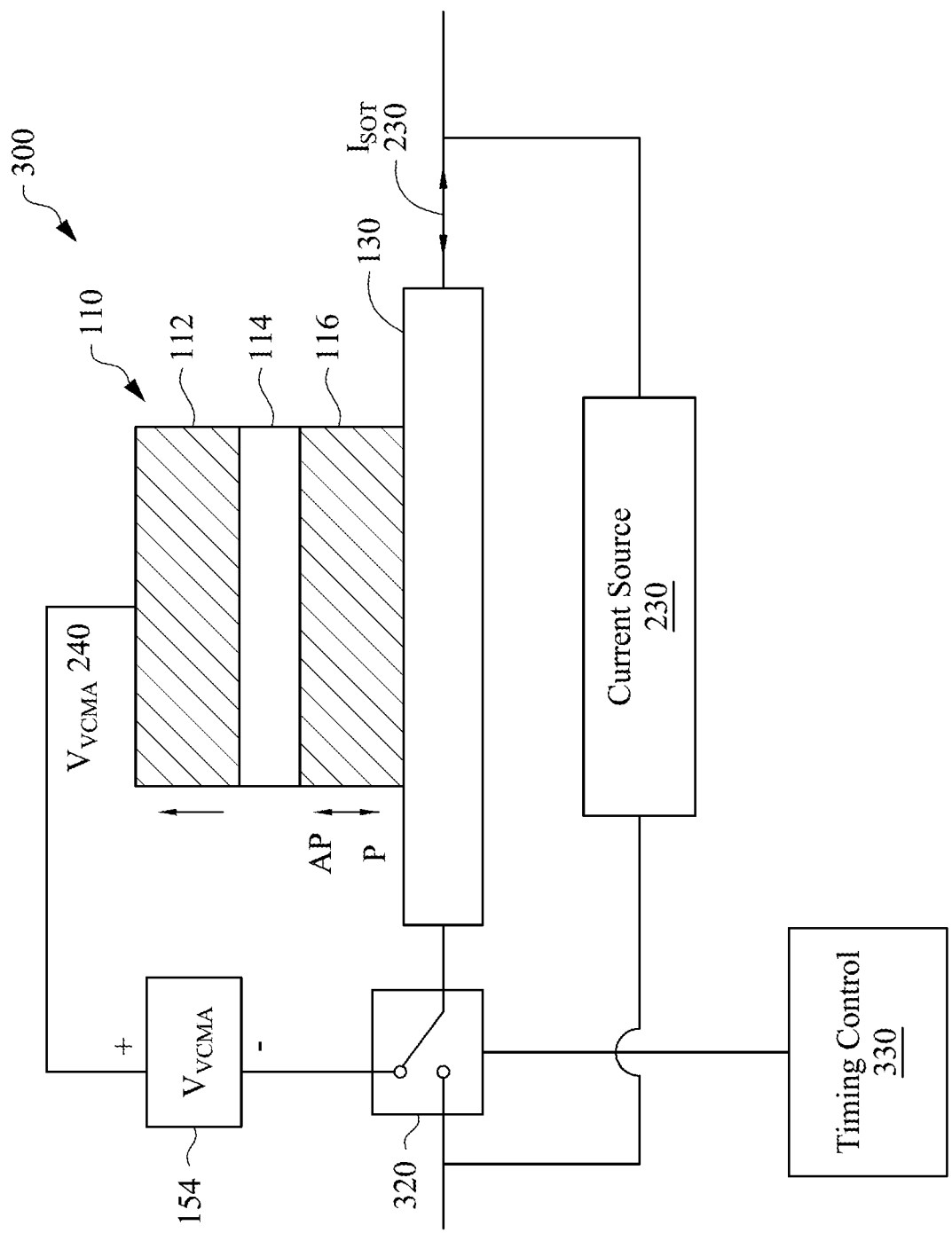
FIG. 3 is an example operation configuration an example write operation to the MRAM cell according to example embodiments of the disclosure.

FIG. 3 shows an example configuration of switching the MTJ 110 state between AP and P. Referring to FIG. 3, a current source 230 is coupled to provide a SOT current 230 to flow through the SOT metal layer 130. For simplicity purposes, the referral number 230 is used to refer to either one or both of the SOT current source or the SOT current as applicable. The $V_{VCMA}$ voltage source 154 is coupled between the reference layer 112 and the free layer 114, through the SOT metal layer 130. For simplicity purposes, the referral number 154 is used to refer to either one or both of the VCMA voltage source and the VCMA voltage as applicable. A switching unit 320 is couple to enable one of the $I_{SOT}$ current 230 or the $V_{VCMA}$ 154 to be applied. The switching unit 320 is illustrated as a three-way switch for illustrative purposes, which does not limit the scope of the disclosure. The $I_{SOT}$ 230 and the $V_{VCMA}$ 154 may be sequentially applied through any switching mechanisms, which are all included in the disclosure.

The switching unit 320 is controlled by a timing control unit 330. The timing control unit 330 may be implemented through hardware logic, embedded software (firmware), a computing device, or other suitable implementation approaches.

Figure 4A:
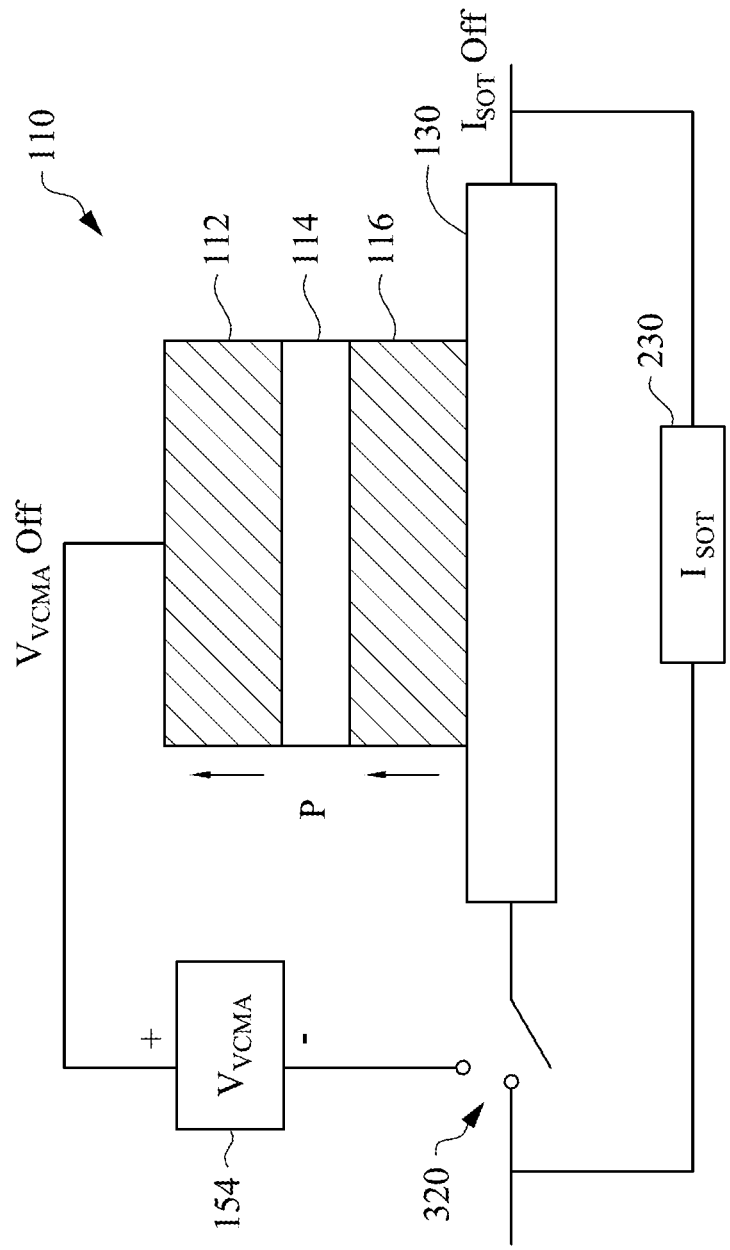
FIGS. 4A to 4D are example stages of switching a MTJ from P state to AP states according to example embodiments of the disclosure.

FIG. 4A to 4D shows an example write operation of switching the MTJ 110 state from the P state to the AP state. As shown in FIG. 4A, the MTJ 110 is initially in a P state in that the magnetization orientations of the reference layer 112 and the free layer 116 are parallel, shown as both in an up orientation for illustrative purposes. This initial P state may represent a logic state stored in the MRAM cell containing the MTJ 110. At this stage, the write operation has not started and both the SOT current source 230 and the VCMA voltage source 154 are not connected, e.g., both the $I_{SOT}$ 230 and the $V_{VCMA}$ 154 are off.

Figure 4B:
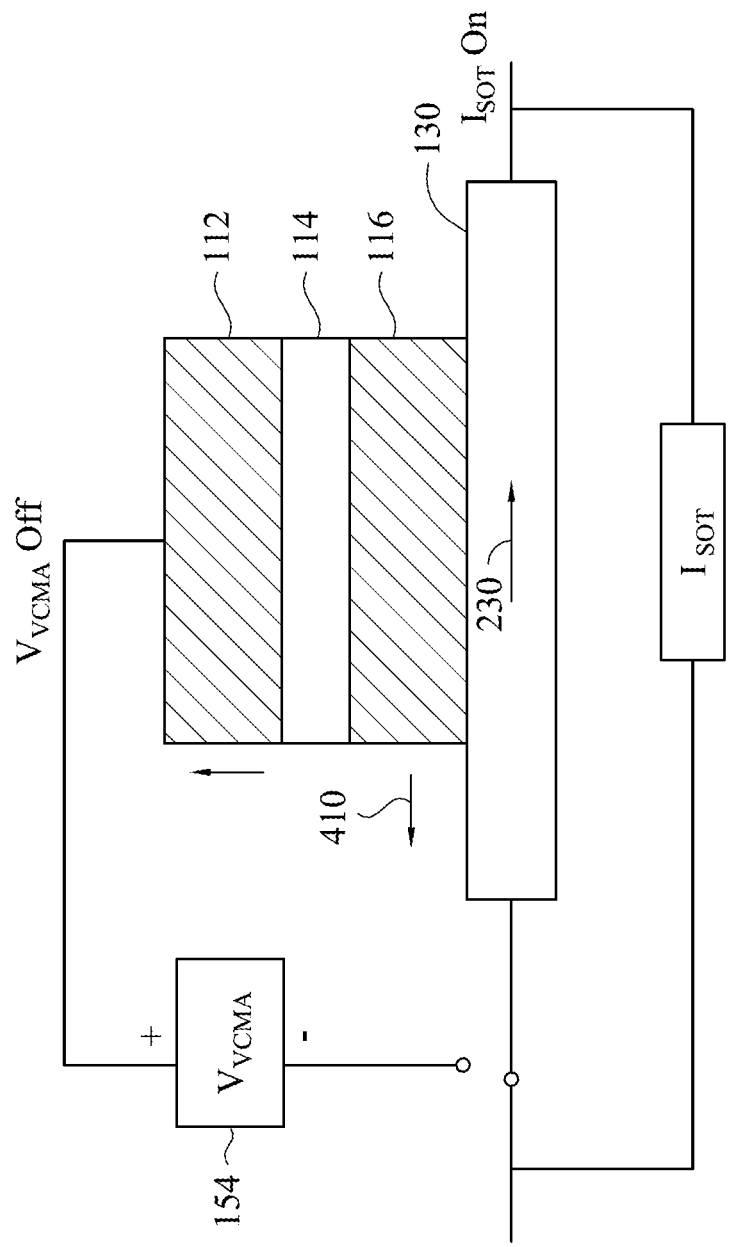

In FIG. 4B, a P-to-AP write operation starts and the SOT current $I_{SOT}$ 230 is firstly (i.e., before the $V_{VCMA}$ 154 is applied) applied through the SOT metal layer 130 in a first direction, shown by the arrow. The SOT current $I_{SOT}$ 230 is on and the VCMA voltage $V_{VCMA}$ 154 is off. The $I_{SOT}$ 230 causes a SOT effect that pulls the magnetization orientation of the free layer 116 into an in-plane orientation 410 following the shape anisotropy of the free layer 116, e.g., the long axis of the free layer 116. When the $I_{SOT}$ 230 is applied, the VCMA voltage source 154 is not applied.

Figure 4C:
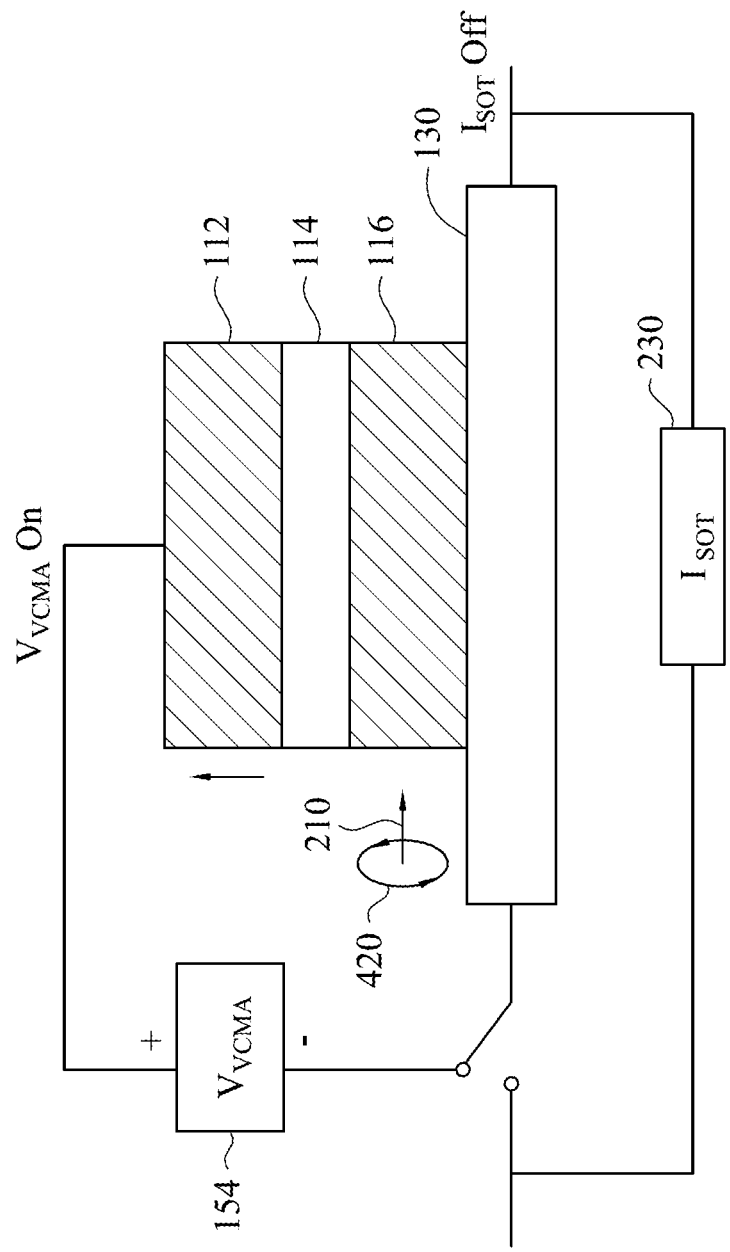

In FIG. 4C, with the write operation continuing, the SOT current source $I_{SOT}$ 230 is removed and the VCMA voltage $V_{VCMA}$ 154 is applied to the MTJ structure 110. The SOT current $I_{SOT}$ 230 is off and the VCMA voltage $V_{VCMA}$ 154 is on. The $V_{VCMA}$ 154 has a voltage value sufficiently large to overcome or remove the energy barrier of the P state MTJ 110 accumulated on the two sides of the tunnel barrier layer 114, which interfaces with the free layer 116 or the reference layer 12, respectively. Without the energy barrier and the SOT effect, the magnetization orientation of the free layer 116 enters into a precession process 420, in which the magnetization orientation rotates around the shape anisotropy of the free layer 116, e.g., the long axis 210 (FIG. 2). The canting angle θ1 (FIG. 2) helps to provide a damping torque for the precession.

As shown by FIGS. 4B and 4C, the $I_{SOT}$ 230 and the $V_{VCMA}$ 154 are applied sequentially with the $V_{VCMA}$ 154 being subsequent to the $I_{SOT}$ 230. A delay between the application of the $I_{SOT}$ 230 and the application of the $V_{VCMA}$ 154 is acceptable as long as $V_{VCMA}$ 154 is applied before the magnetization orientation of the free layer 116 settles at a perpendicular orientation of either the P state or the AP state. To improve system speed, a shorter delay between the $I_{SOT}$ 230 and the $V_{VCMA}$ 154 is generally desired.

Figure 4D:
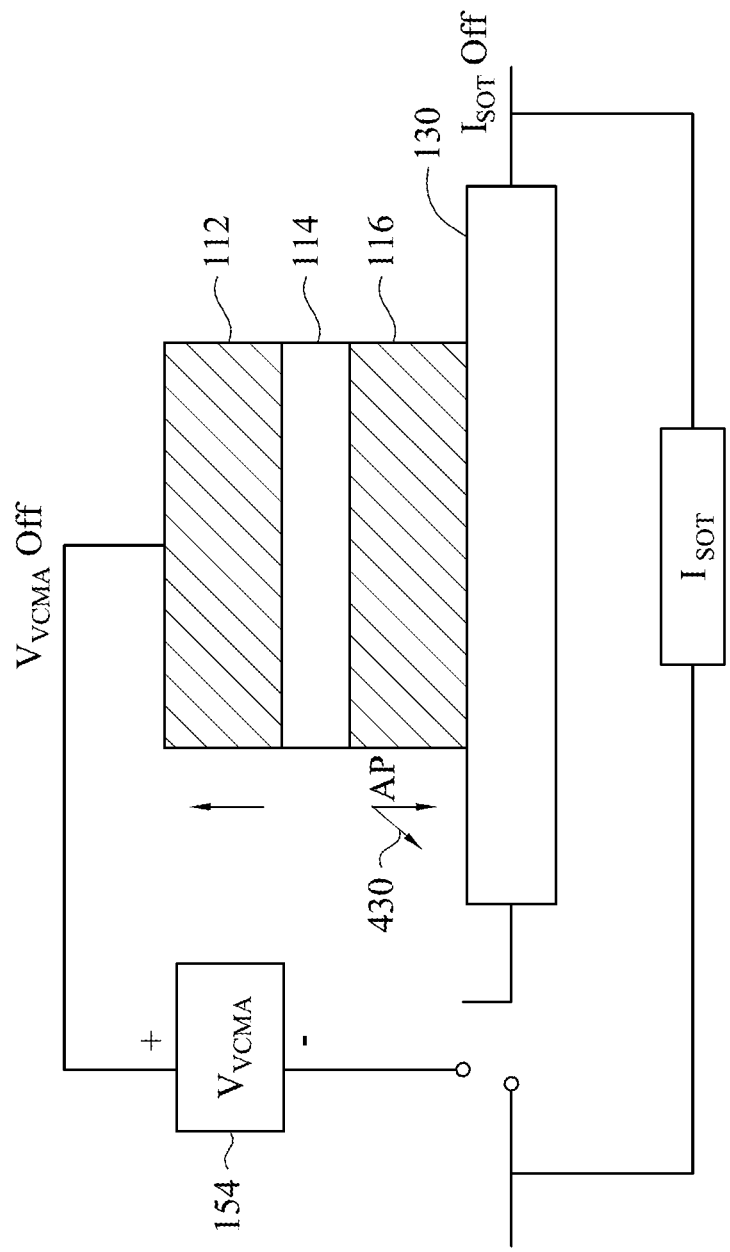

As shown in FIG. 4D, the $V_{VCMA}$ 154 is removed at a point that magnetization orientation of the free layer is adjacent to the target perpendicular orientation, either P or AP, that is set for the MTJ structure 110 under write operation. For example, the $V_{VCMA}$ 154 is removed when the magnetization orientation of the free layer 116 is at a precession end position 430 that is more adjacent to the AP state orientation, here for example the down orientation, than to the P state orientation, here the up orientation. In an embodiment, the $V_{VCMA}$ 154 is removed when the precession end position 430 is closer to the target perpendicular orientation than the adjacent in-plane orientation. As such, after the precession process ends, the magnetization orientation of the free layer 116 will not temporally go back to the in-plane orientation and settle randomly between the AP or P state from the in-plane orientation.

With the $V_{VCMA}$ 154 removed with a proper timing, the magnetization orientation of the free layer exits the precession process 420 and settles at the target perpendicular orientation, here the AP state orientation, which is adjacent to the precession end position 430.

Figure 5A:
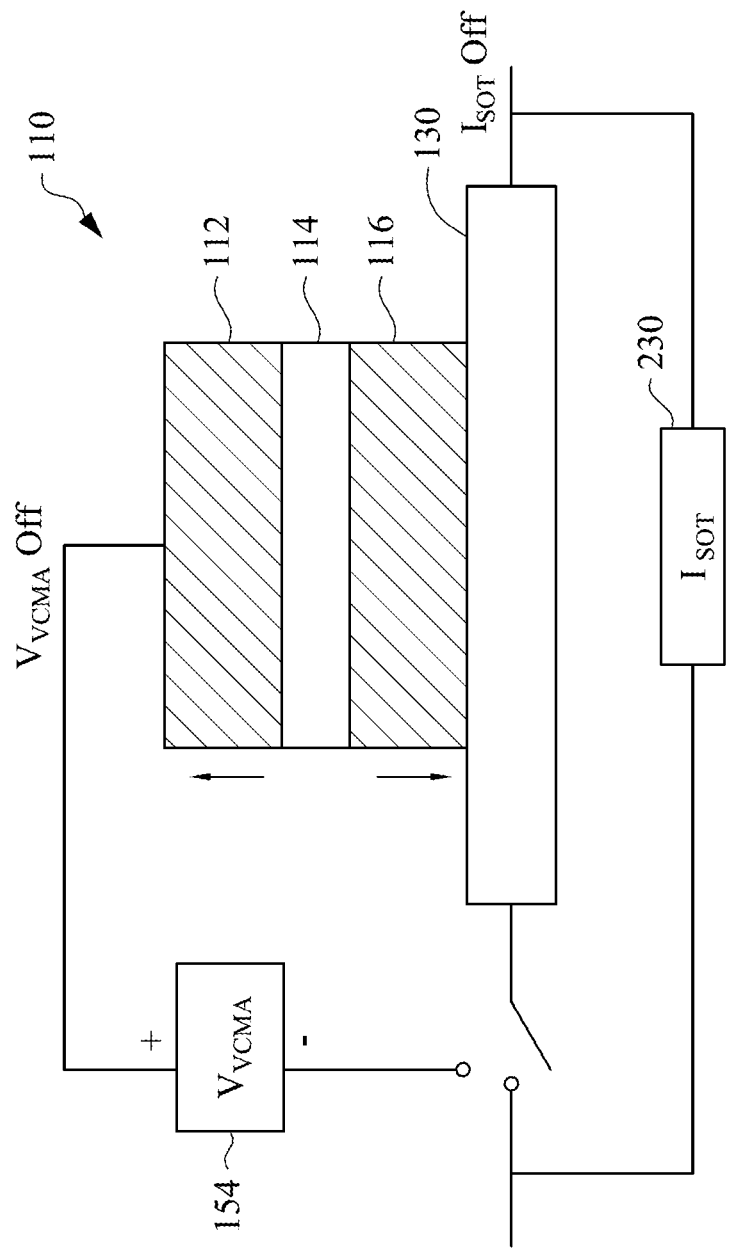
FIGS. 5A to 5D are example stages of switching a MTJ from AP state to P states according to example embodiments of the disclosure.

FIG. 5A to 5D shows an example write operation of switching the MTJ 110 state from the AP state to the P state. As shown in FIG. 5A, the MTJ 110 is initially in an AP state in that the magnetization orientations of the reference layer 112 and the free layer 116 are antiparallel, where the magnetization orientation of the reference layer 112 is at an up orientation and the magnetization orientation of the free layer 116 is at a down orientation for illustrative purposes. This initial AP state may represent a logic state stored in the MRAM cell containing the MTJ 110. At this stage, the write operation has not started and both the SOT current source 230 and the VCMA voltage source 154 are not connected to the MTJ 110, e.g., both the $I_{SOT}$ 230 and the $V_{VCMA}$ 154 are off.

Figure 5B:
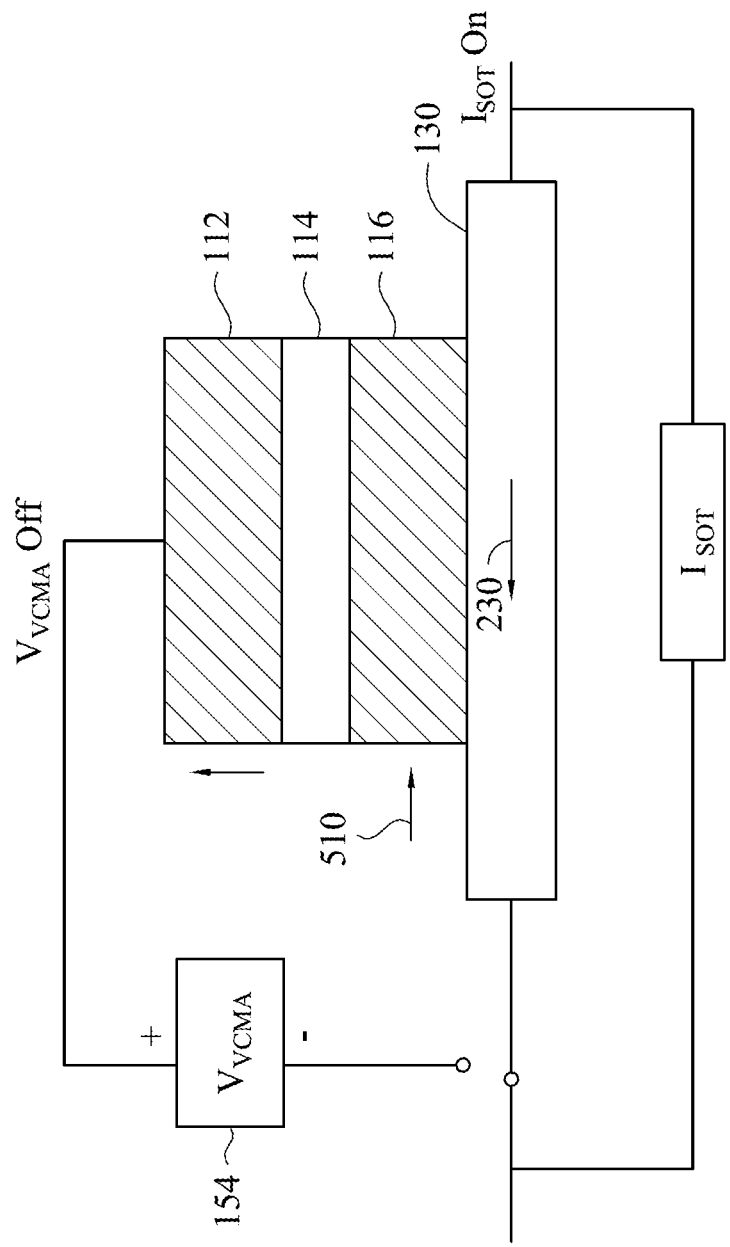

In FIG. 5B, a AP-to-P write operation starts and the $I_{SOT}$ 230 is firstly applied through the SOT metal layer 130 in a second direction that is different from the first direction shown in FIG. 4B. The $I_{SOT}$ 230 causes a SOT effect that pulls the magnetization orientation or orientation of the free layer 116 into an in-plane orientation 510 following the shape anisotropy of the free layer 116, e.g., the long axis of the free layer 116. When the $I_{SOT}$ 230 is applied, the $V_{VCMA}$ 154 is not applied. That is, the SOT current $I_{SOT}$ 230 is on and the $V_{VCMA}$ 154 is off. As shown here, the SOT current $I_{SOT}$ 230 is applied in an second direction opposite to the first direction of FIG. 4B because the initial perpendicular magnetization orientation of the free layer 112 is different from that of FIG. 4A.

Figure 5C:
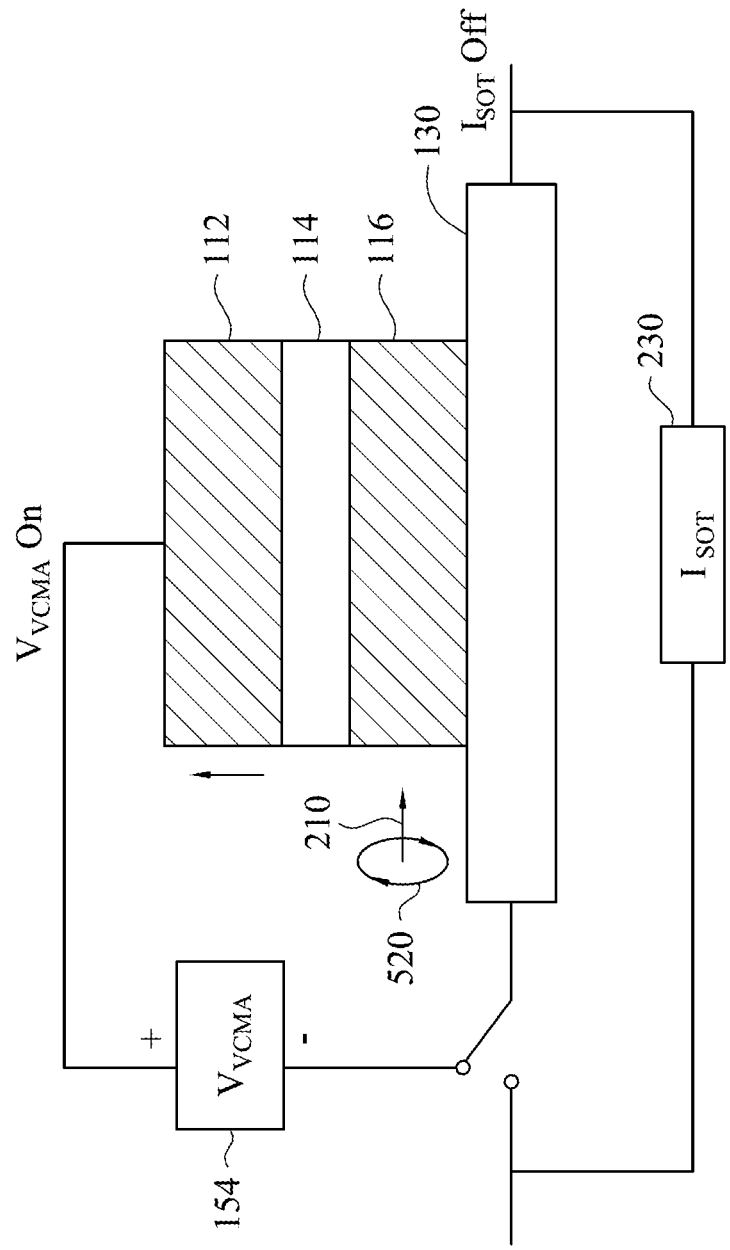

In FIG. 5C, with the write operation continuing, the $I_{SOT}$ 230 is removed and the $V_{VCMA}$ 154 is applied to the MTJ structure 110. The SOT current $I_{SOT}$ 230 is off and the VCMA voltage $V_{VCMA}$ 154 is on. The $V_{VCMA}$ 154 has a voltage value sufficiently to overcome the energy barrier of the AP state MTJ 110 accumulated on the two sides of the tunnel barrier layer 114 that are adjacent to the free layer 116 or the reference layer 112, respectively. It should be appreciated that the energy barrier for the AP state of the MTJ 110 may be different from, e.g., higher than, the energy barrier of the P state MTJ 110. As such, the $V_{VCMA}$ 154 may be applied with a different voltage value to be sufficient to eliminate the respective energy barrier. Without the energy barrier and the SOT effect, the magnetization orientation of the free layer 116 enters into a precession process 520, in which the magnetization orientation rotates around the long axis 210 of the MTJ 110 or specifically the free layer 116. The canting angle θ1 (FIG. 2), if any, helps to provide a damping torque for the precession process.

As shown by FIGS. 5B and 5C, the $I_{SOT}$ 230 and the $V_{VCMA}$ 154 are applied sequentially with the $V_{VCMA}$ 154 applied subsequent to the $I_{SOT}$ 230. A delay between the application of the $I_{SOT}$ 230 and the application of the $V_{VCMA}$ 154 is acceptable as long as the $V_{VCMA}$ 154 is applied before the magnetization orientation of the free layer 116 settles at a perpendicular orientation of either P state or AP state. To improve system speed, a shorter delay between the $I_{SOT}$ 230 and the $V_{VCMA}$ 154 is generally desired.

As shown by FIGS. 4C and 5C, the voltage source 154 is a DC voltage and although the voltage value may change between the P-to-AP switching and the AP-to-P switching, the direction of the $V_{VCMA}$ 154 stays the same between the P to AP switching and the AP to P switching.

Figure 5D:
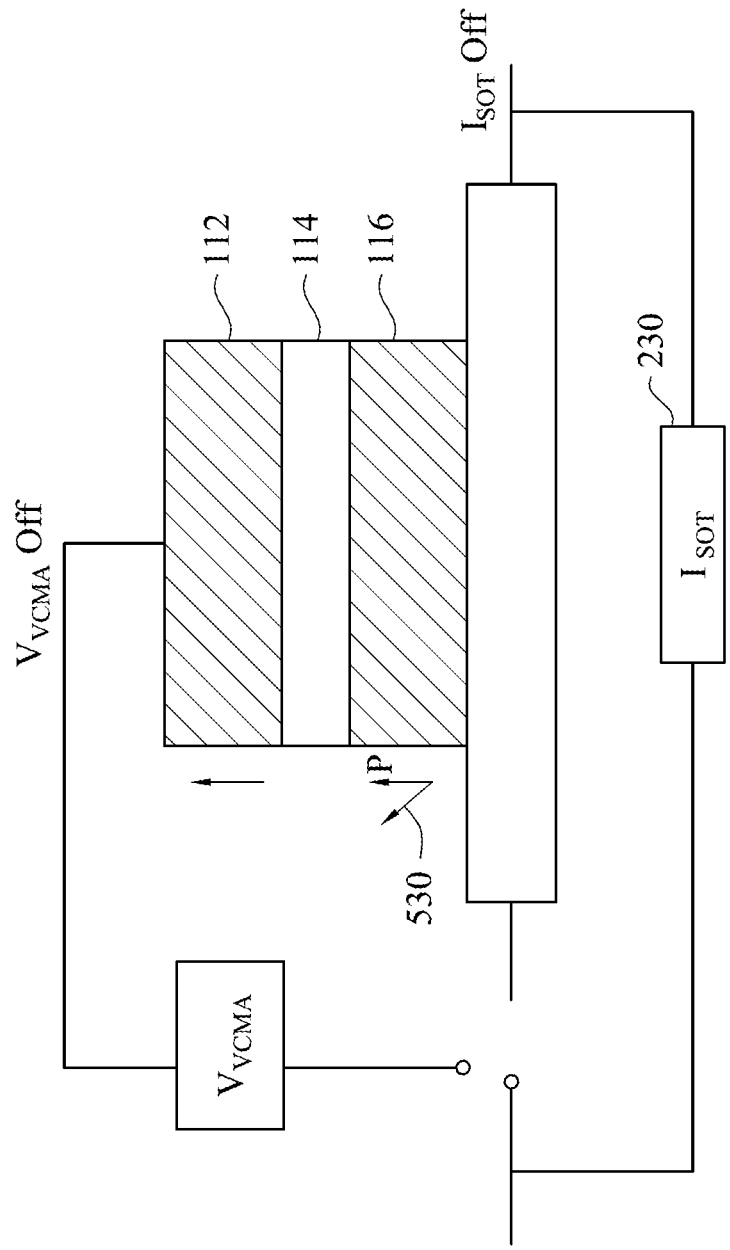

As shown in FIG. 5D, the $V_{VCMA}$ 154 is removed at a point that magnetization orientation of the free layer is adjacent to the target P state perpendicular orientation that is set for the MTJ structure 110 under write operation. For example, the $V_{VCMA}$ 154 is removed when the magnetization orientation of the free layer 116 is at a precession end position 530 that is more adjacent to the P state orientation, here for example the up orientation, than to the AP state orientation, here the down orientation. In an embodiment, the $V_{VCMA}$ 154 is removed when the precession end position 530 is closer to the target P state perpendicular orientation than the adjacent in-plane orientation. As such, after the precession process ends, the magnetization orientation of the free layer 116 will not temporally go back to the in-plane orientation and settle randomly between the AP or P state from the in-plane orientation.

With the $V_{VCMA}$ 154 removed, the magnetization orientation of the free layer 116 exits the precession process 520 and settles at the P state perpendicular orientation, which is adjacent to the precession end position 530 when the $V_{VCMA}$ 154 is removed.

Figure 6A:
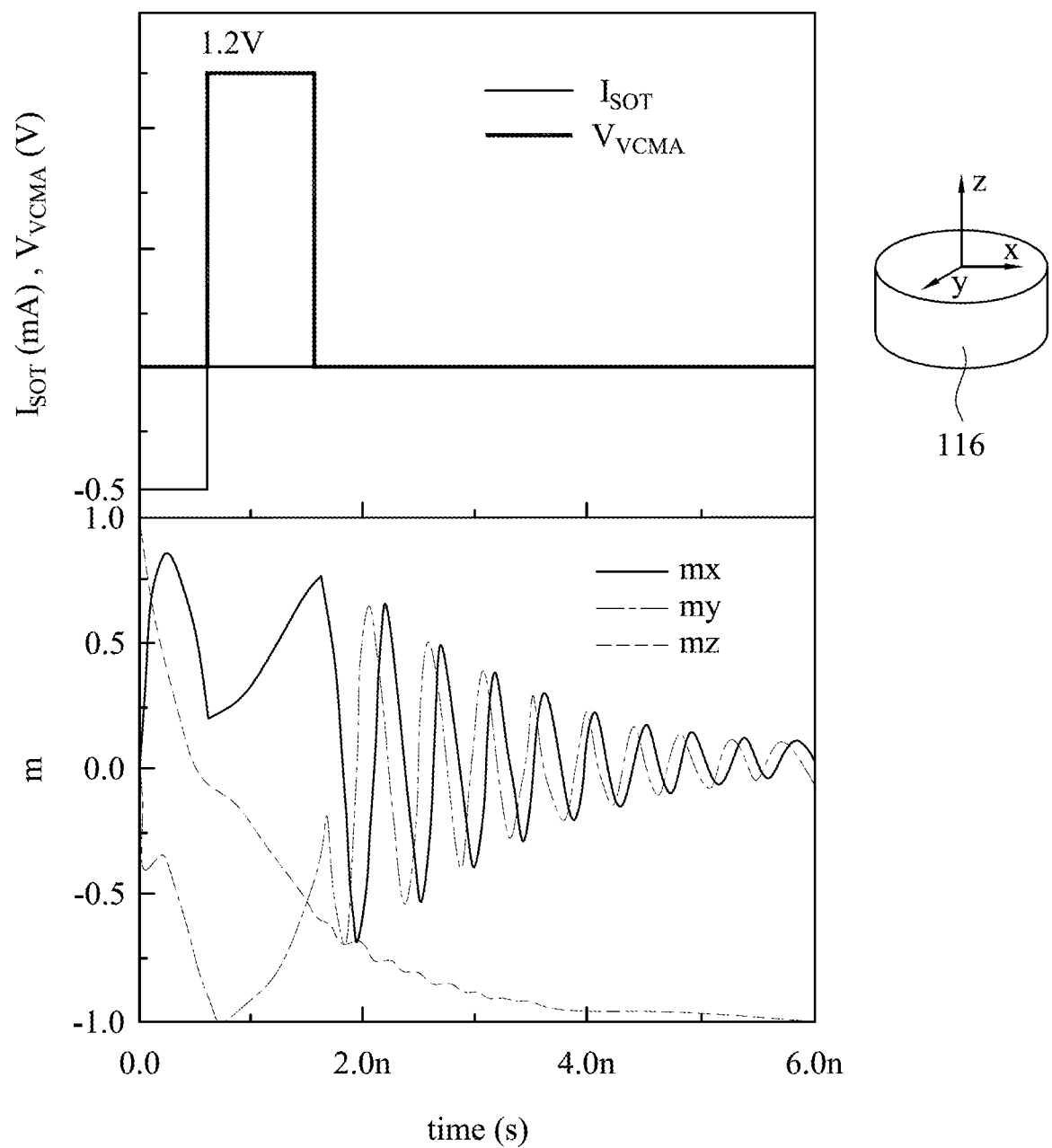
FIGS. 6A to 6D are various timing control configurations of switching a MTJ between P state and AP states according to example embodiments of the disclosure.

FIGS. 6A-6D show example timing control of the on/off of the $I_{SOT}$ 230 and the $V_{VCMA}$ 154 in four example scenarios. In each of the FIGS. 6A-6D, a timing chart of the $I_{SOT}$ 230 and the $V_{VCMA}$ 154 is provided in correspondence to a waveform chart of the magnetization of the free layer 116 in one or more of the x-axis, y-axis and the z-axis. FIG. 6A is an example scenario that the MTJ 110 is switched from the P state to the AP state under a transient timing control approach, e.g., with faster switching speed. The faster switching speed is referred to with respect to the steady timing control approach shown in FIG. 6B as discussed in details herein.

Referring to FIG. 6A, with reference also to FIGS. 4A-4D, at the timing state (1), both the SOT current $I_{SOT}$ 230 and the VCMA voltage $V_{VCMA}$ 154 are off, e.g., at the zero level, and the MTJ 110 is at the initial P state, see FIG. 4A, where the magnetization orientation of the free layer 116 is perpendicular and is in parallel with that of the reference layer 112. FIG. 6A shows that at the timing state (1), the magnetization of the free layer 116 is at a positive maximum value, positive "1.0", at the z-axis ("Z-component"), indicating, e.g., the free layer 116 is at the P state perpendicular orientation with a maximal magnetization value. FIG. 6A also shows that at the timing stage (1), the x-axis magnetization ("X-component") and the y-axis magnetization ("Y-component") are all equal to zero, which indicates that the magnetization orientation of the free layer 116 is fully perpendicular. Note that the X-component, Y-component and the Z-component are all defined with respect to the free layer 116 itself for illustrative purposes.

At the timing state (2), with reference also to FIG. 4B, an $I_{SOT}$ 230 of, for example, 0.5 mA, is applied. The $I_{SOT}$ 230 is applied with a first flow direction, shown as negative ("−") through the SOT metal layer 130. With the rendered SOT effect, the Z-component value ("mz") changes from +1.0 (parallel perpendicular orientation) toward 0 (in-plane orientation), while one or more of the X-component ("mx") or the Y-component ("my") becomes non-zero as the magnetization of the free layer 116 is pulled from the perpendicular orientation toward the in-plane orientation. With the $I_{SOT}$ 230 continuously applied, the Z-component will be pulled to the zero and vibrate about the zero line in a transient period before it settles at zero in a steady in-plane state. Specifically, the Z-component will be firstly pulled by the $I_{SOT}$ 230 beyond the zero line to the AP direction ("−") and then will vibrate back and forth between the P direction (+) and the AP direction (−) about the zero line before it settles at the zero line. The transient timing control removes the $I_{SOT}$ 230 during the transient period and before the z-component settles at the zero line. For example, the $I_{SOT}$ 230 is removed or turned off when the Z-component is pulled adjacent to the zero line. As shown in FIG. 6A as an example, the $I_{SOT}$ 230 is removed when the Z-component is pulled below the zero-line at the first time. This example does not limit the scope of the disclosure and the $I_{SOT}$ 230 may be removed at other time points when the Z-component is pulled adjacent to the zero-line. For example, the $I_{SOT}$ 230 may be removed when the z-component is within a range of ±0.1 about the zero line, 0.1 indicates 10% of the magnetization value at the P or AP states (±1.0, respectively). In an embodiment, the $I_{SOT}$ 230 may be removed when the Z-component is within a range of ±0.05 about the zero line. With the $I_{SOT}$ 230 removed, the timing stage (2) terminates.

At the timing state (3), with reference also to FIG. 4C, the $V_{VCMA}$ 154 is applied. The $V_{VCMA}$ 154 is applied with a voltage value sufficient to eliminate the energy barrier of the P state. Here, a voltage value of 1.2V is shown as an illustrative example. The voltage is a DC voltage. With the $V_{VCMA}$ 154 is applied, the magnetization of the free layer 116 enters into a precession process, in which the Z-component and one or more of the X-component and the Y component rotate or vibrate between the +1 and −1 and the intermediate states therebetween. The $V_{VCMA}$ 154 is removed at a point when the magnetization orientation of the free layer 116 rotates to a position that is more adjacent to the target perpendicular orientation, here AP, than the opposite perpendicular orientation P. FIG. 6A shows the P-to-AP switching, where the AP orientation is the target orientation. As such, the $V_{VCMA}$ 154 is removed at a point where the Z-components is in the AP direction, e.g., Z-component value is negative. In an embodiment, $V_{VCMA}$ 154 is removed at a point when the magnetization orientation of the free layer 116 rotates to a position that is more adjacent to the target perpendicular orientation AP than an adjacent in-plane orientation. For example, as shown in FIG. 6A, the $V_{VCMA}$ 154 is removed at a point when the Z-component is about −0.625, i.e., the magnetization orientation of the free layer 116 is closer to the AP state (−1) than the adjacent in-plane orientation (0). A range of the positions where the magnetization orientation of the free layer 116 is closer to the target perpendicular orientation (P or AP) than the adjacent in-plane orientation (0) is referred to as the target zone. If the $V_{VCMA}$ 154 is removed when the magnetization orientation of the free layer 116 is within a target zone, here the AP target zone, the magnetization orientation of the free layer 116 tends to settle at the target AP perpendicular orientation instead of temporally going back to the in-plane orientation and then settling randomly at one of the AP or the P state orientation.

Figure 7:
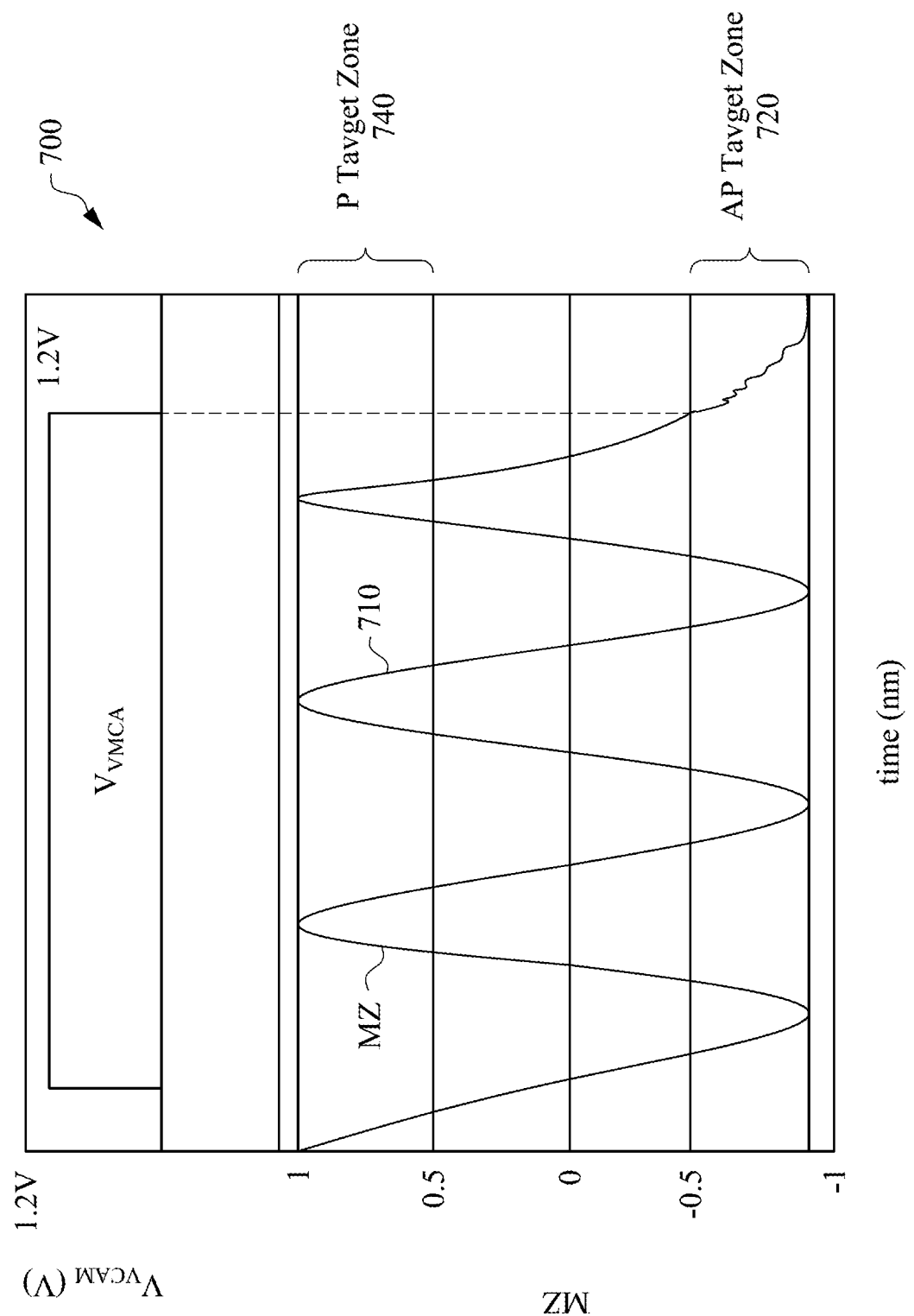
FIG. 7 is an example precession process of a magnetization orientation of a free layer according to example embodiments of the disclosure.

As a transient timing control, FIG. 6A shows that the $V_{VCMA}$ 154 is removed at the first time the magnetization orientation of the free layer 116 rotates into the target zone. This is not necessary. Due to the nature of the precession process, the magnetization orientation of the free layer 116 may revisit the target zone until the $V_{VCMA}$ 154 is removed to end the precession. FIG. 7 shows an example precession process and the target zones to remove the $V_{VCMA}$ 154. As shown in FIG. 7, with the $V_{VCMA}$ 154 continuously applied, the Z-component ("mz") waveform 710 may enter the AP target zone 720 (a zone between −0.5 to −1 of the Z-component "mz" precession wave) multiple times. The Z-component ("mz") waveform 710 may also enter the P target zone 740 (a zone between 0.5 to 1 of the Z-component "mz" precession wave) multiple times. In a case that the $V_{VCMA}$ 154 is removed when the Z-component is in the AP target zone 720, the magnetization orientation of the free layer 116 will end precession and settle at the AP orientation. When the $V_{VCMA}$ 154 is removed, the timing stage (3) terminates.

Referring back to FIG. 6A, with reference also to FIG. 4D, in timing stage (4), with the $V_{VCMA}$ 154 and the $I_{SOT}$ 230 both turned off, the magnetization orientation of the free layer 116 gradually ends the precession and settles at the target perpendicular orientation, here the AP orientation.

Figure 6B:
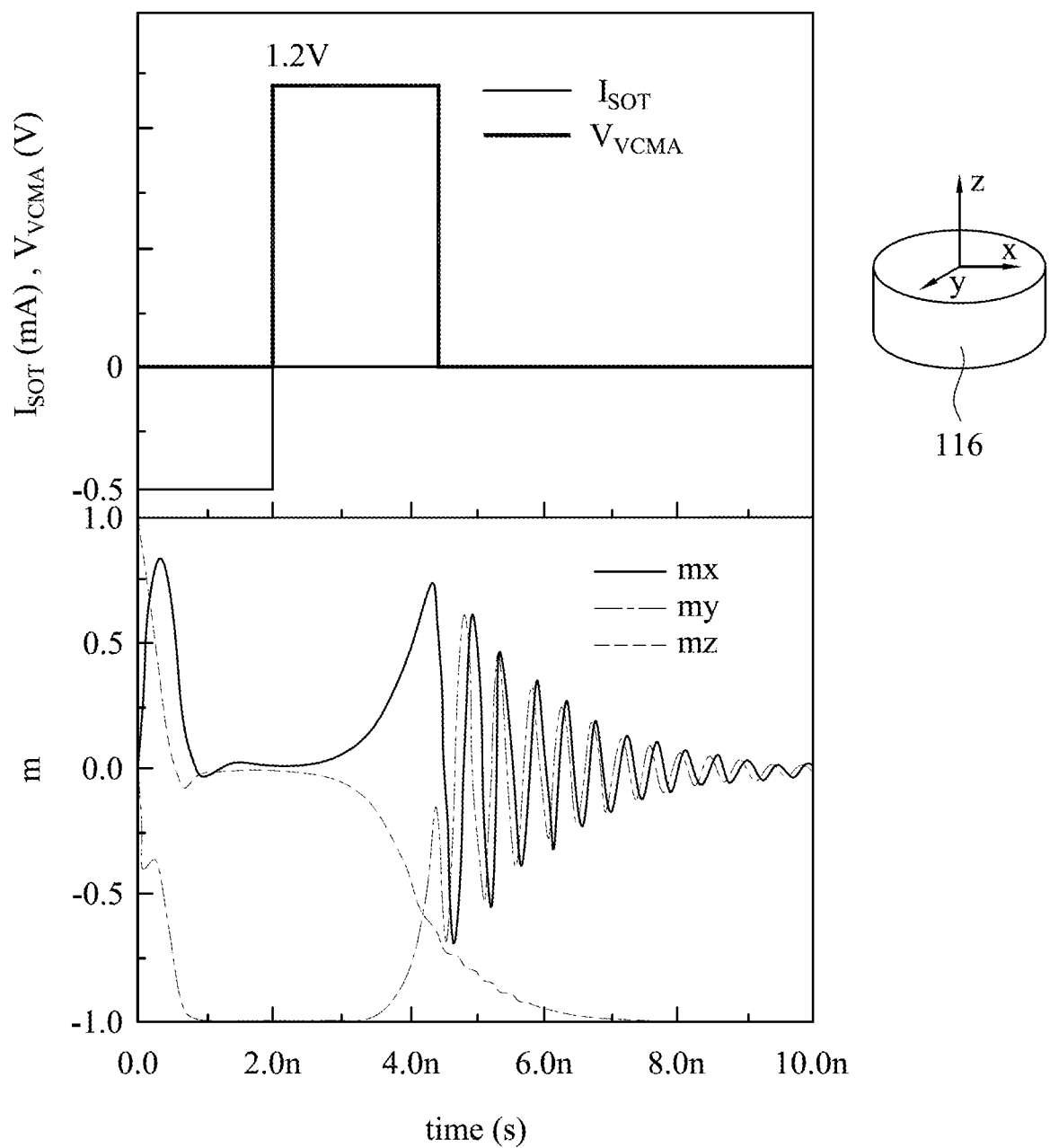

FIG. 6B is an example scenario that the MTJ 110 is switched from the P state to the AP state in a steady timing control, e.g., with a slower switching speed. The slower switching speed is referred to with respect to the transient timing control shown in FIG. 6A as discussed in details herein.

Referring to FIG. 6B, with reference also to FIGS. 4A-4D, the timing stage (1) and the timing stage (4) in FIG. 6B are similar to those of FIG. 6A. For simplicity purposes, the description of the timing stages (1) and (4) of FIG. 6B are omitted. Referring to timing stage (2) of FIG. 6B, under the steady timing control, the $I_{SOT}$ 230 is not removed when the Z-component "mz" is firstly pulled to a position adjacent the zero line. That is, the $I_{SOT}$ 230 is not removed when the magnetization orientation of the free layer 116 is pulled transiently in-plane and is still vibrating. Instead, the $I_{SOT}$ 230 is removed when the magnetization orientation of the free layer 116 become steady at the in-plane orientation. As illustratively shown in FIG. 6B, the magnetization orientation of the free layer 116 is pulled by the adjacent to the in-plane orientation at about 0.7 ns while the $I_{SOT}$ 230 is removed at about 2 ns after the application of the $I_{SOT}$ 230.

Referring to the timing stage (3) of FIG. 6B, because the $V_{VCMA}$ 154 is applied when the magnetization orientation of the free layer 116 becomes steadily at the in-plane orientation, it may take a longer period of precession time for the magnetization orientation of the free layer 116 to enter the target zone, here the AP target zone 720 (FIG. 7). FIG. 6B shows that it takes about 2 ns for the magnetization orientation of the free layer 116 to enter the AP target zone 720 at the first time. For comparison, in FIG. 6A, it takes about 1 ns for the magnetization orientation of the free layer 116 to enter the AP target zone 720 at the first time. So the steady timing control tends to prolong or delay the timing stage (3) as well as the timing stage (2).

The steady timing control or the transient timing control both have its own advantages. For example, the steady timing control provides more tolerance and flexibility in the timing design of the system. The transient timing control provides much faster speed in switching between the P state and the AP state of the MTJ 110.

Figure 6C:
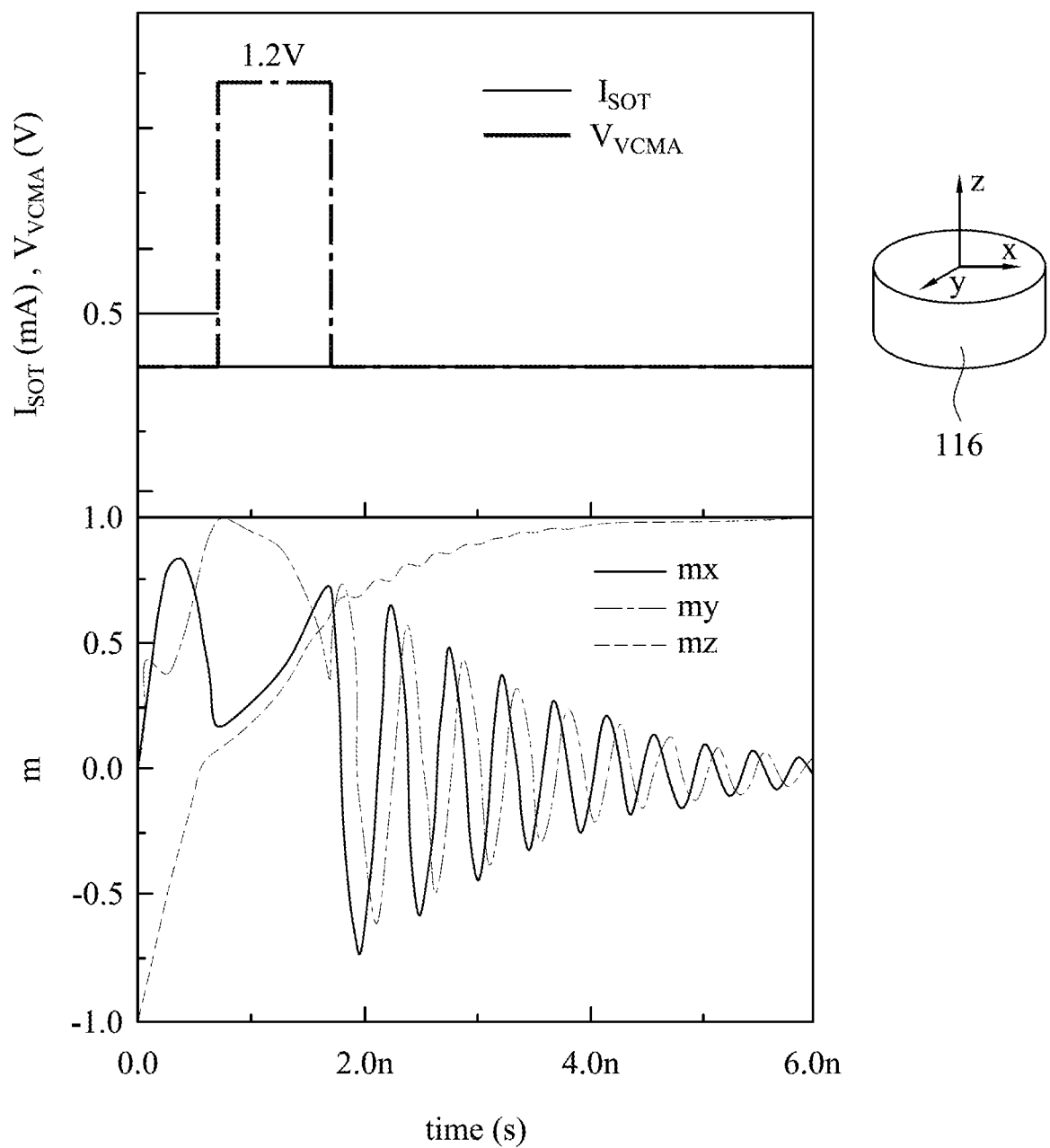

FIG. 6C is an example scenario that the MTJ 110 is switched from the AP state to the P state in a transient timing control, e.g., faster switching speed. The faster switching speed is referred to with respect to the steady timing control shown in FIG. 6D as discussed in details herein.

Referring to FIG. 6C, with reference also to FIGS. 5A-5D, at the timing state (1), both the $I_{SOT}$ 230 and the $V_{VCMA}$ 154 are off, e.g., at the zero level, and the MTJ 110 is at the initial AP state, see FIG. 5A, where the magnetization orientation of the free layer 116 is perpendicular and is anti-parallel with that of the reference layer 112. FIG. 6A shows that at the timing state (1), the magnetization orientation of the free layer 116 is at a negative maximum value, "−1.0", indicating an AP perpendicular orientation with maximal magnetization value in the z-axis. FIG. 6C also shows that at the timing stage (1), the X-component ("mx") and the Y-component ("my") are all equal to zero, which indicates that the magnetization orientation of the free layer 116 is fully perpendicular.

At the timing state (2), with reference also to FIG. 5B, an $I_{SOT}$ 230 of 0.5 mA is applied. The $I_{SOT}$ 230 is applied with a second flow direction, shown as positive ("+"), through the SOT metal layer 130. Note that the $I_{SOT}$ 230 for the AP-to-P switch has a different flow direction than that of the P-to-AP switch as shown in FIGS. 6A and 6B. With the SOT effect rendered, the Z-component value changes from −1.0 (anti-parallel perpendicular orientation) toward 0 (in-plane orientation), while one or more of the X-component or the Y-component value becomes non-zero because the magnetization orientation of the free layer 116 is pulled from the perpendicular orientation toward the in-plane orientation. With the $I_{SOT}$ 230 continuously applied, the Z-component will be pulled to the zero and vibrate about the zero in a transient period before it settle at zero in a steady in-plane orientation. In the transient period, the Z-component will be firstly pulled by the $I_{SOT}$ 230 beyond the zero to the P direction and then vibrates back and forth between the P direction (+) and the AP direction (−) about the zero line before it settles at the zero line. The transient timing control approach eliminates or reduces the vibration by removing the $I_{SOT}$ 230 during the transient period. For example, the $I_{SOT}$ 230 is removed or turned off immediately upon the Z-component is firstly pulled adjacent to the zero line. As shown in FIG. 6C as an example, the $I_{SOT}$ 230 is removed when the Z-component is firstly pulled above the zero-line before the Z-component vibrates back to the AP orientation.

This example does not limit the scope of the disclosure and the $I_{SOT}$ 230 may be removed at other time points in the transient period. For example, the $I_{SOT}$ 230 may be removed when the z-component is within a range of ±0.1 about the zero line, where 0.1 indicating 10% of the magnetization value at the P or AP states (±1.0, respectively). In an embodiment, the $I_{SOT}$ 230 may be removed when the z-component is within a range of ±0.05 about the zero line. With the $I_{SOT}$ 230 removed, the timing stage (2) terminates.

At the timing state (3), with reference also to FIG. 5C, the $V_{VCMA}$ 154 is applied. The $V_{VCMA}$ 154 is applied with a voltage value sufficient to eliminate the energy barrier of the AP state. Here, a voltage value of 1.2V is shown as an illustrative example, same as the P-to-AP switch of FIGS. 6A, 6B. However, the voltage value for the AP-to-P switch may be different from, e.g., larger than, that of the P-to-AP switch because the energy barrier accumulated on the two sides of the tunnel barrier layer 114 may be different. The $V_{VCMA}$ 154 is a DC voltage. That is, a same voltage direction is applied for the AP-to-P switch and the P-to-AP switch. With the $V_{VCMA}$ 154 applied, the magnetization orientation of the free layer 116 enters a precession process, in which the Z-component and one or more of the X-component and the Y component rotate or vibrate between the polarities +1 and −1 and the intermediate states therebetween. The $V_{VCMA}$ 154 is removed at a point when the magnetization orientation of the free layer 116 rotates to a position that is more adjacent to the target perpendicular orientation, e.g., the P state orientation, than the opposite perpendicular orientation, the AP state orientation. FIG. 6C shows the AP-to-P switching, where the P orientation is the target orientation. As such, the $V_{VCMA}$ 154 is removed at a point where the Z-component is in the P direction, e.g., Z-component value is positive in FIG. 6C. In an embodiment, $V_{VCMA}$ 154 is removed at a point when the magnetization orientation of the free layer 116 rotates to a position that is more adjacent to the target P state orientation than an adjacent in-plane orientation. For example, as shown in FIG. 6C, the $V_{VCMA}$ 154 is removed at a point when the Z-component is about +0.625, i.e., the magnetization orientation of the free layer 116 is closer to the P state (+1 for Z-component) than the adjacent in-plane orientation (0 for Z-component). A range of the positions where the magnetization orientation of the free layer 116 is closer to the target perpendicular orientation (+1) than the adjacent in-plane orientation (0) is referred to as the target zone. If the $V_{VCMA}$ 154 is removed when the magnetization orientation of the free layer 116 is within the target zone, the magnetization orientation of the free layer 116 tends to settle at the target P state perpendicular orientation instead of temporally going back to the adjacent in-plane orientation and then settling randomly at one of the AP or the P state orientation.

As a transient timing control, FIG. 6C shows that the $V_{VCMA}$ 154 is removed at the first time the magnetization orientation of the free layer 116 rotates into the P state target zone. This is not necessary. Due to the nature of the precession process, the magnetization orientation of the free layer 116 may revisit the target zone until the $V_{VCMA}$ 154 is removed.

Figure 8:
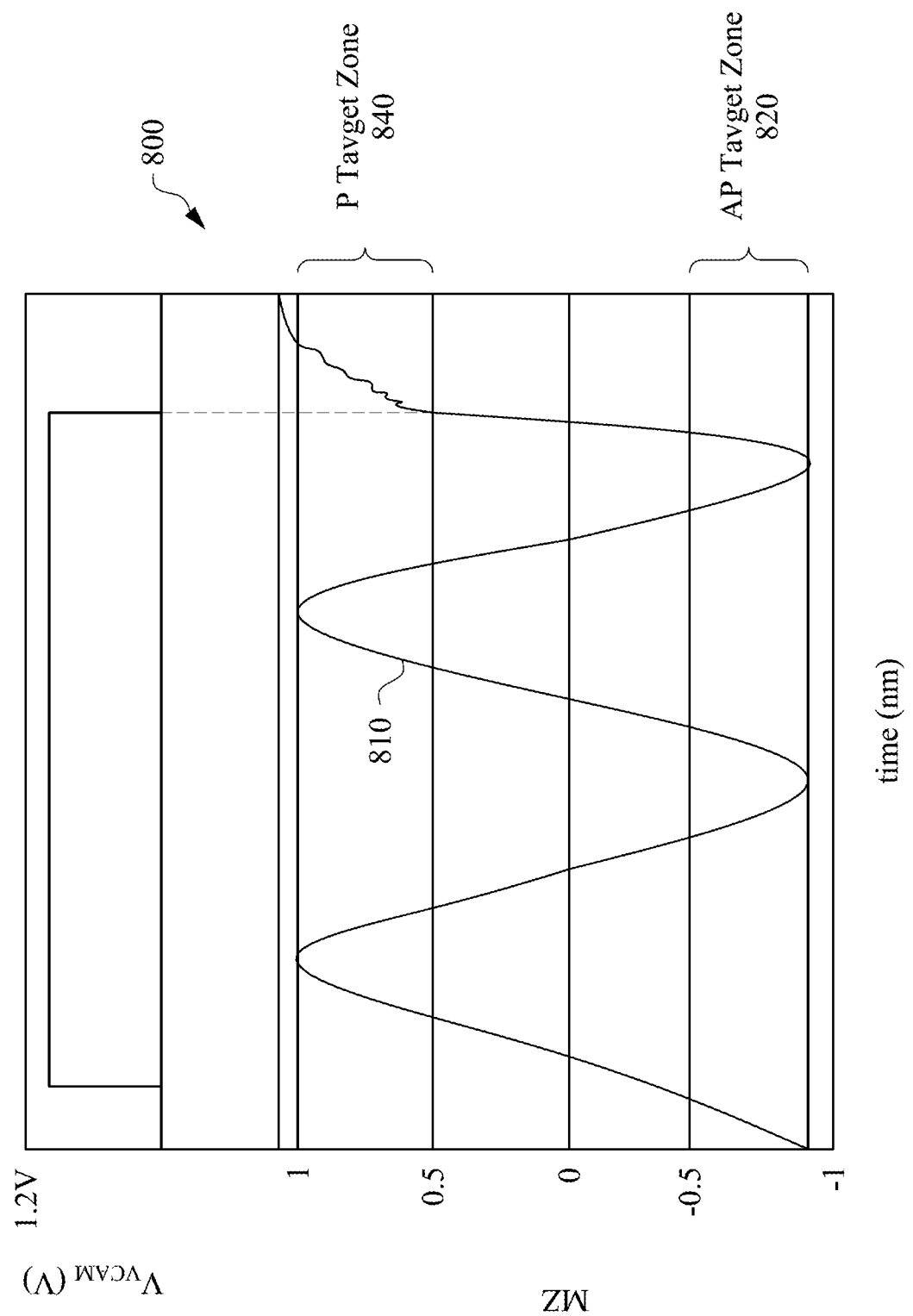
FIG. 8 is another example precession process of a magnetization orientation of a free layer according to example embodiments of the disclosure.

FIG. 8 shows an example precession process 800 with AP state target zone 820 and P state target zone 840. As shown in FIG. 8, with the $V_{VCMA}$ 154 continuously applied, the Z-component ("mz") waveform 810 may enter the AP target zone 820 (a zone between −0.5 to −1 of the mz precession 810 waveform) and the P target zone 840 (a zone between +0.5 to +1 of the mz precession 810 wave) multiple times. In a case that the $V_{VCMA}$ 154 is removed when the Z-component is in the P target zone 840, the magnetization orientation of the free layer 116 will end precession and settle at the P state perpendicular orientation. When the $V_{VCMA}$ 154 is removed, the timing stage (3) terminates.

In FIGS. 7 and 8, the z-component waveforms of the magnetization are shown as vibrating between −1 and 1 in the precession process. This is an example scenario where the magnetization orientation can temporarily reaches the perpendicular P state or the AP state orientations in the precession. In the case that the magnetization of the free layer 116 includes one or more of the X-component or the Y-component, the magnetization may not rotate to the full AP or P state orientation and the Z-component may not vibrate between values −1 and 1 (i.e., the full magnetization value). Instead, the Z-component mz will be smaller than the full magnetization value 1. All such variant scenarios are possible and included in the disclosure.

Referring back to FIG. 6C, with reference also to FIG. 5D, in timing stage (4), with the $V_{VCMA}$ 154 and the $I_{SOT}$ 230 are both turned off, the magnetization orientation of the free layer 116 gradually ends the precession and settles at the target perpendicular orientation, here the P orientation.

Figure 6D:
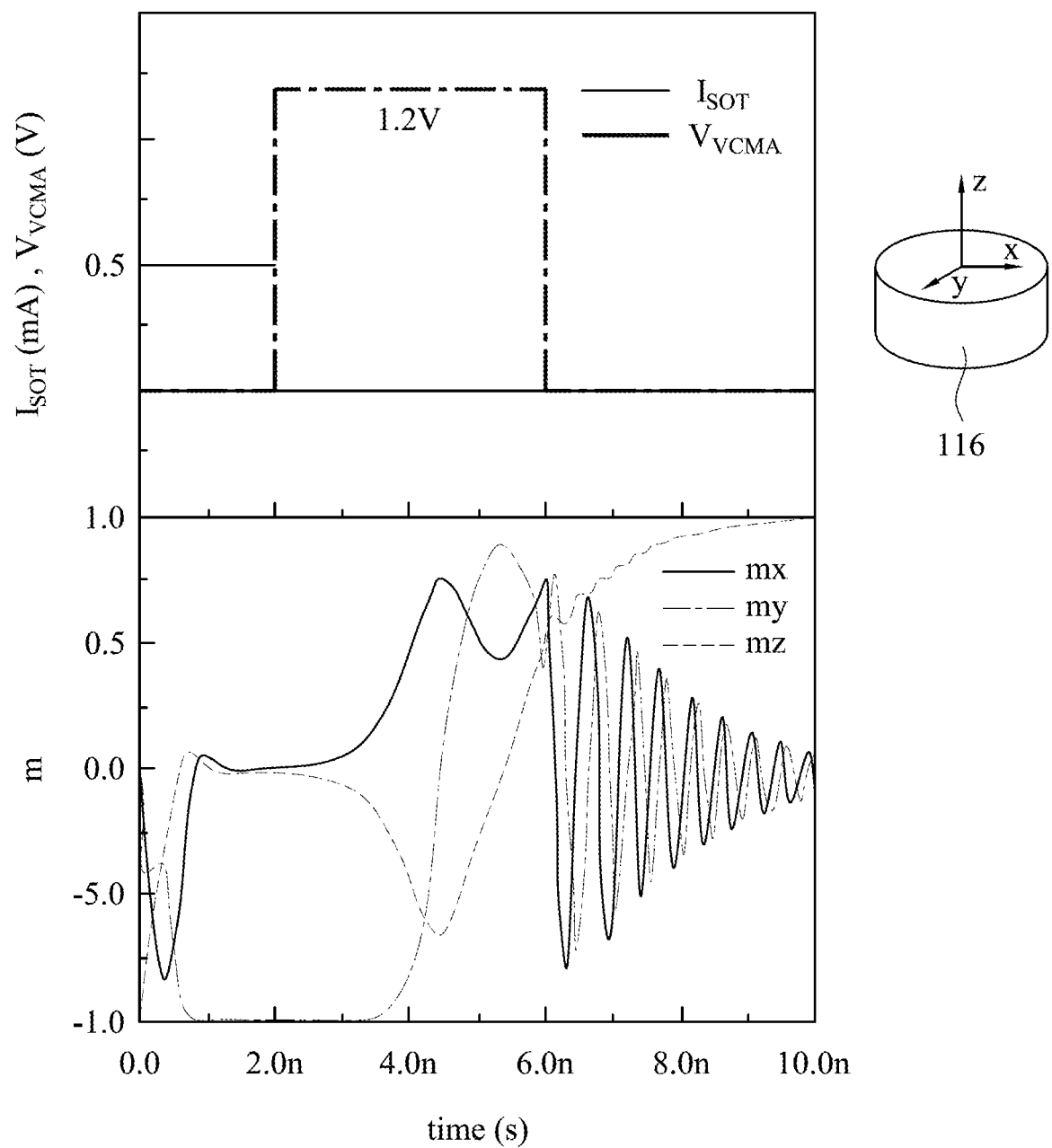

FIG. 6D is an example scenario that the MTJ 110 is switched from the AP state to the P state in a steady timing control, e.g., with a slower switching speed. The slower switching speed is referred to with respect to the transient timing control shown in FIG. 6C as discussed in details herein.

Referring to FIG. 6D, with reference also to FIGS. 5A-5D, the timing stage (1) and timing stage (4) in FIG. 6D are similar to that of FIG. 6C. For simplicity purposes, the description of the timing stages (1) and (4) of FIG. 6D are omitted. Referring to timing stage (2) of FIG. 6D, for the steady timing control, the $I_{SOT}$ 230 is not removed until the magnetization orientation of the free layer 116 becomes steady at the in-plane orientation. As illustratively shown in FIG. 6D, the magnetization orientation of the free layer 116 is pulled by the $I_{SOT}$ 230 transiently adjacent to the in-plane orientation at about 0.7 ns while the $I_{SOT}$ 230 is removed at about 2 ns after its application.

Referring to timing stage (3) of FIG. 6B, because the $V_{VCMA}$ 154 is applied when the magnetization orientation of the free layer 116 becomes steadily at the in-plane orientation, it may take longer period of precession time for the magnetization orientation of the free layer 116 to enter the target zone, here the P state target zone (see also, P state target zone 840 in FIG. 8). FIG. 6D shows that it takes about 4 ns for the magnetization of the free layer 116 to enter the AP target zone, e.g., between 0.5 to 1, at the first time. In FIG. 6C, it takes about 1 ns for the magnetization orientation of the free layer 116 to enter the P target zone. So the steady timing control tends to prolong or delay the timing stage (3) as well as the timing stage (2). As shown in FIG. 6D, the magnetization orientation of the free layer 116 first rotate toward the AP state orientation before it moves toward the P state orientation, which is an illustrative example and does not limit the scope of the disclosure.

The effects of the on/off effects of the $I_{SOT}$ 230 or the $V_{VCMA}$ 154 may be determined based on one or more of simulation or experiments. For example, the waveforms of the FIGS. 6A-6D and 7 and 8 may be obtained through simulation or experiments. With those waveforms provided, the timing control of the timing stages (1), (2), (3), (4) of the FIGS. 6A-6D can be determined accordingly, depending on circuit and devices designs and configurations. In further embodiments, alternatively or additionally, the magnetization orientation of the free layer 116, e.g., the magnetization orientation or the magnetization values in one or more of the X-component, Y-component or the Z-component, may be monitored or measured in real time and the real-time monitoring results may be used to control the timing of the $I_{SOT}$ 230 or the $V_{VCMA}$ 154.

Figure 9:
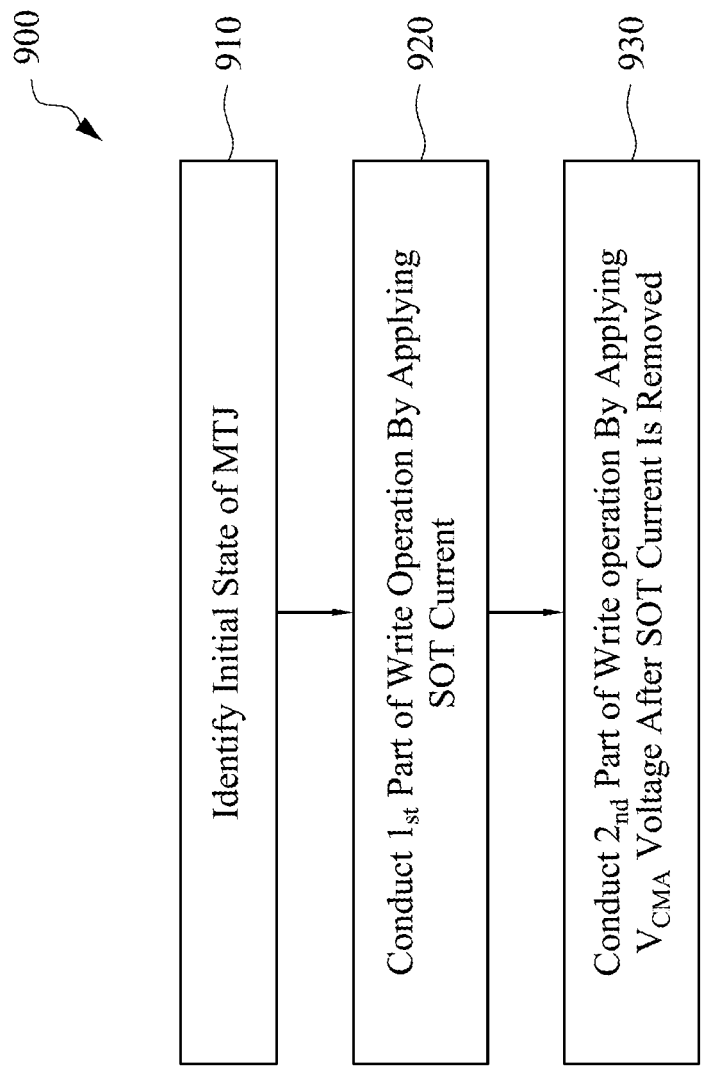
FIG. 9 is an example process of a write operation to an example MRAM cell according to example embodiments of the disclosure.

FIG. 9 shows an example process 900. Referring to FIG. 9, in example operation 910, an initial logic state of a MRAM memory cell 100 is identified. The logic state corresponds to the state of the MTJ structure 110 of the MRAM cell, i.e., either AP or P.

In example operation 920, a first part of a write operation is conducted by applying an $I_{SOT}$ 230 onto the MRAM cell 100, e.g., through a SOT metal layer 130. The $I_{SOT}$ 230 is applied for with a flow direction determined based on the initial logic state of the MRAM cell 100 and for a first duration that is sufficiently long to at least pull the magnetization orientation of the free layer 116 of the MTJ structure 110 adjacent to the in-plane orientation.

In example operation 930, a second part of the write operation is conducted by applying a $V_{VCMA}$ 154 onto the MRAM cell 100, after the $I_{SOT}$ 230 is removed. The $V_{VCMA}$ 154 has a voltage value that is sufficiently large to remove the energy barrier accumulated on both sides of the tunnel barrier layer 114 of the MTJ structure 110, while the $V_{VCMA}$ 154 is not so large as to break the dielectric barrier of the tunnel barrier layer 114. The $V_{VCMA}$ 154 enables the magnetization orientation of the free layer 116 to enter into a precession process. The $V_{VCMA}$ 154 is removed when the magnetization orientation of the free layer 116 rotates to a position within a target zone of the target magnetization state under the write operation, i.e., either P or AP. It should be appreciated that the target state of the MTJ 110 may be the same as the initial state or may be a difference one of AP or P.

With the voltage-controlled magnetic anisotropy effect rendered by the $V_{VCMA}$ 154, the disclosed techniques achieve a deterministic switching of SOT-MTJ without the assistance of an external field or a large canting angle. A small canting angle of less than 5 degree is desirable but not required. With such a small canting angle, power consumption and switching speed can both be improved comparing to traditional SOT-MTJ.

The present disclosure may be further appreciated with the description of the following embodiments:

In a method embodiment, a first heavy metal layer is formed over a substrate. A dielectric material is deposited over the first heavy metal layer. An average thickness of the deposited dielectric material is controlled to be less than a diameter of a molecule of the dielectric material. A second heavy metal layer is formed over the dielectric material and the first heavy metal layer.

In another embodiment, a structure includes a magnetic tunnel junction structure including a reference layer, a free layer and a tunneling barrier layer sandwiched between the reference layer and the free layer. A spin-orbit torque layer is positioned adjacent to the free layer of the magnetic tunnel junction structure. The spin-orbit torque layer includes a first heavy metal layer, a second heavy metal layer and a first dielectric layer sandwiched between the first heavy metal layer and the second heavy metal layer.

In a further embodiment, a memory device includes a substrate, a transistor over the substrate, and a magnetoresistive random access memory cell over the transistor. The transistor has a first source/drain terminal, a second source/drain terminal and a gate terminal. The magnetoresistive random access memory cell includes a magnetic tunnel junction structure and a spin-orbit torque structure adjacent to the magnetic tunnel junction structure. A write signal line is coupled to the gate terminal of the transistor. A first current node is coupled to the first source/drain terminal. A first end of the spin-orbit torque structure is coupled to the second source/drain terminal. A second end of the spin-orbit torque structure is coupled to a second current node. The spin-orbit torque structure includes a first heavy metal layer, a second heavy metal layer stacked over the first heavy metal layer, and a first plurality of molecules of a dielectric material scattered adjacent to an interface between the first heavy metal layer and the second heavy metal layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   applying a spin-orbit torque current through a spin-orbit torque metal layer coupled to a magnetic tunnel junction structure during a first time period, the magnetic tunnel junction structure including a reference layer, a free layer and a tunneling barrier layer stacked between the reference layer and the free layer, two sides of the tunneling barrier layer interfacing with the reference layer or the free layer, respectively;
   removing the spin-orbit torque current after a magnetization of the free layer is pulled from a perpendicular orientation to a second orientation adjacent to an in-plane orientation and before the second orientation of the magnetization of the free layer stabilizes at the in-plane orientation; and
   applying a voltage between the two sides of the tunneling barrier layer during a second time period subsequent to the first time period, the voltage being smaller than a first threshold such that the tunneling barrier layer remains electrical insulating during the second time period.

2. The method of claim 1, further comprising identifying a magnetization orientation of the free layer before the first time period is in one of a first perpendicular orientation or a second perpendicular orientation.

3. The method of claim 2, wherein the applying the spin-orbit torque current includes applying the spin hall current to flow through the spin-orbit torque metal layer in a direction selected based on the magnetization orientation of the free layer before the first time period.

4. The method of claim 2, wherein the applying the voltage includes applying the voltage in a same direction no matter whether the magnetization orientation of the free layer is in the first perpendicular orientation or in the second perpendicular orientation before the first time period.

5. The method of claim 1, wherein the spin-orbit torque current is removed after the second orientation of the magnetization of the free layer stabilizes at the in-plane orientation.

6. The method of claim 1, wherein the voltage is removed when a magnetization orientation of the free layer rotates in a precession process to a position that is more adjacent to a first perpendicular orientation that is set for the magnetic tunnel junction structure than a second perpendicular orientation opposite to the first perpendicular orientation.

7. The method of claim 6, wherein the voltage is removed when the magnetization orientation of the free layer rotates to a position that is more adjacent to the first perpendicular orientation that is set for the magnetic tunnel junction structure than an adjacent in-plane orientation.

8. The method of claim 1, wherein the applying the spin-orbit torque current includes applying the spin-orbit torque current to flow in a direction that has a canting angle with a shape anisotropy of the free layer, the canting angle being one of smaller than about 5 degree or larger than 85 degree.

9. The method of claim 1, wherein the applying the spin-orbit torque current includes applying the spin-orbit torque current to flow in a direction that has a canting angle with a shape anisotropy of the free layer, the canting angle being within a range of one of between about 0 degree and about 90 degree or between about 90 degree to about 180 degree.

10. The method of claim 1, wherein the voltage is larger than a second threshold to remove an energy barrier accumulated by the two sides of the tunneling barrier layer.

11. A method, comprising:
identifying a magnetic tunnel junction structure that includes a reference layer, a free layer and a tunneling barrier layer stacked vertically between the reference layer and the free layer;
applying a spin-orbit torque current through a spin-orbit torque metal layer adjacent to the free layer of the magnetic tunnel junction structure using a current source coupled to the spin-orbit torque metal layer;
removing the spin-orbit torque current after a magnetization orientation of the free layer is adjacent to an in-plane orientation; and
applying an electrical potential on the tunneling barrier layer through a voltage source coupled to two sides of the tunneling barrier layer that interface with the reference layer or the free layer, respectively, wherein the electrical potential is sufficiently large to eliminate an energy barrier between an antiparallel state and a parallel state of the magnetic tunnel junction structure,
wherein the applying the spin-orbit torque current includes applying the spin-orbit torque current to flow in a direction that has a canting angle with a shape anisotropy of the free layer the canting angle being within a range of one of between about 0 degree and about 90 degree or between about 90 degree to about 180 degree.

12. The method of claim 11, wherein the voltage source is coupled between the reference layer and the spin-orbit torque metal layer.

13. The method of claim 11, wherein the voltage source is a direct current voltage source.

14. The method of claim 11, comprising removing the electrical potential when the magnetization orientation of the free layer is adjacent to a target perpendicular orientation.

15. The method of claim 12, further comprising controlling one or more of a first timing of turning off the current source or a second timing of turning off the voltage source through a control element.

16. The method of claim 11, wherein the canting angle is one of smaller than about 5 degree or larger than 85 degree.

17. A method, comprising:
identifying a magnetoresistive random-access memory element, the magnetoresistive random-access memory element having a magnetic tunnel junction structure including a reference layer, a free layer and a tunneling barrier layer stacked vertically between the reference layer and the free layer, a spin-orbit torque metal layer adjacent to the free layer of the magnetic tunnel junction structure, a current source coupled to the spin-orbit torque metal layer and a voltage source coupled to between the reference layer and the spin-orbit torque metal layer;
applying a spin-orbit torque current through the spin-orbit torque metal layer by turning on the current source;
removing the spin-orbit torque current after a magnetization orientation of the free layer is adjacent to an in-plane orientation;
applying an electrical potential on the tunneling barrier layer by turning on the voltage source after the removing the spin-orbit torque current, the electrical potential enabling the magnetization orientation of the free layer engaging into a precession process; and
removing the electrical potential when the magnetization orientation of the free layer is adjacent to a target perpendicular orientation in the precession process.

18. The method of claim 17, wherein when the electrical potential is applied, there is no electrical current flowing through the tunneling barrier layer.

19. The method of claim 17, wherein the applying the spin-orbit torque current includes applying the spin-orbit torque current with a flow direction based on an initial magnetization orientation of the free layer, and the applying an electrical potential includes applying the electrical potential with a direction independent of the initial magnetization orientation of the free layer.

20. The method of claim 17, wherein the spin-orbit torque current is removed after the magnetization orientation of the free layer stabilizes at the in-plane orientation.

* * * * *